US012757595B2

(12) United States Patent
Du et al.

(10) Patent No.: US 12,757,595 B2
(45) Date of Patent: Oct. 6, 2026

(54) DISPLAY SUBSTRATE AND DISPLAY DEVICE HAVING SHIELDING PATTERN FOR SHIELDING COMPENSATION CONNECTION PORTION

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Lili Du, Beijing (CN); Weiyun Huang, Beijing (CN); Yao Huang, Beijing (CN); Binyan Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 357 days.

(21) Appl. No.: 18/557,036

(22) PCT Filed: Jan. 10, 2023

(86) PCT No.: PCT/CN2023/071474
§ 371 (c)(1),
(2) Date: Oct. 24, 2023

(87) PCT Pub. No.: WO2023/143032
PCT Pub. Date: Aug. 3, 2023

(65) Prior Publication Data

US 2024/0224671 A1 Jul. 4, 2024

(30) Foreign Application Priority Data

Jan. 29, 2022 (CN) ........................ 202210112263.6

(51) Int. Cl.
*H10K 59/131* (2023.01)
*H10D 86/40* (2025.01)
(Continued)

(52) U.S. Cl.
CPC ................................. *H10K 59/131* (2023.02)

(58) Field of Classification Search
CPC .... H10K 59/126; H10K 59/131; H10K 59/12; H10D 86/441; G09G 3/3233; G09G 2300/0426
See application file for complete search history.

(56) References Cited

U.S. PATENT DOCUMENTS

2020/0312924 A1* 10/2020 Choi .................... G09G 3/3258
2021/0217836 A1* 7/2021 Lee .................... H10K 59/1216
(Continued)

FOREIGN PATENT DOCUMENTS

CN 106847825 A 6/2017
CN 107946321 A 4/2018
(Continued)

OTHER PUBLICATIONS

First Chinese Office Action for Chinese Patent Application No. 202210112263.6 mailed Mar. 31, 2026. 26 pages.

*Primary Examiner* — Sonya McCall-Shepard
(74) *Attorney, Agent, or Firm* — BROOKS KUSHMAN P.C.

(57) ABSTRACT

A display substrate and a display device. The display substrate includes a base substrate, and a plurality of sub-pixels and a plurality of initialization signal lines arranged on the base substrate. Each sub-pixel includes a sub-pixel driving circuitry and a shielding pattern, and the sub-pixel driving circuitry includes a driving transistor and a compensation transistor. The compensation transistor includes a compensation active layer, the compensation active layer includes a
(Continued)

first compensation channel portion, a second compensation channel portion and a compensation connection portion, and the compensation connection portion is coupled to the first compensation channel portion and the second compensation channel portion. The shielding pattern is coupled to a corresponding initialization signal line, and an orthogonal projection of the shielding pattern onto the base substrate at least partially overlaps with an orthogonal projection of the compensation connection portion onto the base substrate.

19 Claims, 21 Drawing Sheets

(51) Int. Cl.

| | |
|---|---|
| ***H10D 86/60*** | (2025.01) |
| ***H10K 59/12*** | (2023.01) |
| ***H10K 59/126*** | (2023.01) |

(56) References Cited

U.S. PATENT DOCUMENTS

| | | | | |
|---|---|---|---|---|
| 2021/0335989 | A1 | 10/2021 | Diao et al. | |
| 2021/0359058 | A1 | 11/2021 | Cho et al. | |
| 2022/0102459 | A1 | 3/2022 | Yang et al. | |
| 2023/0165076 | A1 * | 5/2023 | Han | G09G 3/3233 257/72 |

FOREIGN PATENT DOCUMENTS

| | | | |
|---|---|---|---|
| CN | 110112160 | A | 8/2019 |
| CN | 112017593 | A | 12/2020 |
| CN | 112436042 | A | 3/2021 |
| CN | 112470286 | A | 3/2021 |
| CN | 113593478 | A | 11/2021 |
| CN | 216980566 | U | 7/2022 |
| KR | 20130057735 | A | 6/2013 |
| WO | 2021102905 | A1 | 6/2021 |

* cited by examiner

DISPLAY SUBSTRATE AND DISPLAY DEVICE HAVING SHIELDING PATTERN FOR SHIELDING COMPENSATION CONNECTION PORTION

CROSS-REFERENCE TO RELATED APPLICATIONS

This application is the U.S. national phase of PCT Application No. PCT/CN2023/071474 filed on Jan. 10, 2023, which claims priority to Chinese Patent Application No. 202210112263.6 filed on Jan. 29, 2022, which are incorporated herein by reference in their entireties.

TECHNICAL FIELD

The present disclosure relates to the field of display technology, in particular to a display substrate and a display device.

BACKGROUND

Along with an increasing demand on a visual effect, a high-resolution display product has become a new trend. As the resolution increases, a pixel size decreases, leading to an increase in the difficulty in pixel layout. Hence, there is an urgent need to provide a scheme for ensuring the operation stability of a sub-pixel driving circuitry as well as the display quality of the display product while overcoming the difficulty in the pixel layout.

SUMMARY

An object of the present disclosure is to provide a display substrate and a display device, so as to solve the above-mentioned problems.

The present disclosure provides the following technical solutions.

In one aspect, the present disclosure provides in some embodiments a display substrate, including a base substrate, and a plurality of sub-pixels and a plurality of initialization signal lines arranged on the base substrate. Each sub-pixel in the plurality of sub-pixels includes a sub-pixel driving circuitry and a shielding pattern, and the sub-pixel driving circuitry includes a driving transistor and a compensation transistor. A first electrode of the compensation transistor is coupled to a second electrode of the driving transistor, and a second electrode of the compensation transistor is coupled to a gate electrode of the driving transistor. The compensation transistor includes a compensation active layer, the compensation active layer includes a first compensation channel portion, a second compensation channel portion and a compensation connection portion, and the compensation connection portion is coupled to the first compensation channel portion and the second compensation channel portion. The shielding pattern is coupled to a corresponding initialization signal line, and an orthogonal projection of the shielding pattern onto the base substrate at least partially overlaps with an orthogonal projection of the compensation connection portion onto the base substrate.

In a possible embodiment of the present disclosure, the shielding pattern and the corresponding initialization signal lines are of a one-piece structure.

In a possible embodiment of the present disclosure, the initialization signal line includes at least a portion extending in a first direction, and the shielding pattern includes at least a portion extending in a second direction intersecting the first direction. The sub-pixel driving circuitry further includes a first conductive connection portion, a first end of the first conductive connection portion is coupled to the second electrode of the compensation transistor, and a second end of the first conductive connection portion is coupled to the gate electrode of the driving transistor. In the first direction, an orthogonal projection of the shielding pattern onto the base substrate, an orthogonal projection of the second compensation channel portion onto the base substrate, and an orthogonal projection of the first end of the first conductive connection portion onto the base substrate are sequentially arranged.

In a possible embodiment of the present disclosure, the shielding pattern includes a strip-like pattern extending along the second direction, a first end of the shielding pattern is coupled to the initialization signal line, and an orthogonal projection of a second end of the shielding pattern onto the base substrate at least partially overlaps with the orthogonal projection of the compensation connection portion onto the base substrate. In the first direction, a width of the second end of the shielding pattern is larger than a width of the first end of the shielding pattern.

In a possible embodiment of the present disclosure, the sub-pixel further includes a connection pattern, the sub-pixel driving circuitry further includes a first reset transistor, a second electrode of the first reset transistor is coupled to the second electrode of the compensation transistor through the connection pattern, and the orthogonal projection of the shielding pattern onto the base substrate does not overlap with an orthogonal projection of the connection pattern onto the base substrate.

In a possible embodiment of the present disclosure, the orthogonal projection of the shielding pattern onto the base substrate and the orthogonal projection of the connection pattern onto the base substrate are arranged in the first direction.

In a possible embodiment of the present disclosure, the sub-pixel further includes a light-emitting element, the sub-pixel driving circuitry further includes a second reset transistor, and a second electrode of the second reset transistor is coupled to an anode of the light-emitting element. The second reset transistor includes a second reset active layer, and an orthogonal projection of the second reset active layer onto the base substrate and the orthogonal projection of the shielding pattern onto the base substrate are arranged in the second direction.

In a possible embodiment of the present disclosure, the plurality of initialization signal lines includes a plurality of first initialization signal lines, the shielding pattern is coupled to a corresponding first initialization signal line, and a first electrode of the first reset transistor is coupled to the first initialization signal line. The display substrate further includes a plurality of second initialization signal lines, the first electrode of the second reset transistor is coupled to a corresponding second initialization signal line, and the orthogonal projection of the second reset active layer onto the base substrate does not overlap with an orthogonal projection of the first initialization signal line onto the base substrate.

In a possible embodiment of the present disclosure, the sub-pixel further includes a second conductive connection portion, a first end of the second conductive connection portion is coupled to the first electrode of the first reset transistor, and a second end of the second conductive connection portion is coupled to the first initialization signal line. An orthogonal projection of the first end of the second conductive connection portion onto the base substrate is located at a first side of the orthogonal projection of the first initialization signal line onto the base substrate, the orthogonal projection of the shielding pattern onto the base substrate is located at a second side of the orthogonal projection of the first initialization signal line onto the base substrate, and the first side is opposite to the second side in the second direction.

In a possible embodiment of the present disclosure, the display substrate further includes a plurality of power source lines, each power source line in the plurality of power source lines includes at least a portion extending in the second direction, and the orthogonal projection of the shielding pattern onto the base substrate does not overlap with an orthogonal projection of the power source line onto the base substrate.

In a possible embodiment of the present disclosure, the initialization signal line includes at least a portion extending in a first direction, and the shielding pattern includes at least a portion extending in a second direction intersecting the first direction. The sub-pixel driving circuitry further includes a first conductive connection portion, a first end of the first conductive connection portion is coupled to the second electrode of the compensation transistor, and a second end of the first conductive connection portion is coupled to the gate electrode of the driving transistor. At least a portion of the orthogonal projection of the shielding pattern onto the base substrate and an orthogonal projection of the first conductive connection portion onto the base substrate are arranged in the second direction.

In a possible embodiment of the present disclosure, the sub-pixel further includes a connection pattern, the sub-pixel driving circuitry further includes a first reset transistor, a second electrode of the first reset transistor is coupled to the second electrode of the compensation transistor through the connection pattern, and the orthogonal projection of the shielding pattern onto the base substrate partially overlaps with an orthogonal projection of the connection pattern onto the base substrate.

In a possible embodiment of the present disclosure, the sub-pixel further includes a light-emitting element, the sub-pixel driving circuitry further includes a second reset transistor, a second electrode of the second reset transistor is coupled to an anode of the light-emitting element, and the second reset transistor includes a second reset active layer. The first end of the shielding pattern is coupled to the initialization signal line, and an orthogonal projection of the second end of the shielding pattern onto the base substrate at least partially overlaps with the orthogonal projection of the compensation connection portion onto the base substrate, an orthogonal projection of the first end of the shielding pattern onto the base substrate and at least a portion of an orthogonal projection of the second reset active layer onto the base substrate are arranged along the first direction, and an orthogonal projection of the second end of the shielding pattern onto the base substrate and the orthogonal projection of the second reset active layer onto the base substrate are arranged in the second direction.

In a possible embodiment of the present disclosure, the plurality of initialization signal lines includes a plurality of first initialization signal lines, the shielding pattern is coupled to a corresponding first initialization signal line, and a first electrode of the first reset transistor is coupled to the first initialization signal line. The display substrate further includes a plurality of second initialization signal lines, a first electrode of the second reset transistor is coupled to a corresponding second initialization signal line, and the orthogonal projection of the second reset active layer onto the base substrate partially overlaps with an orthogonal projection of the first initialization signal line onto the base substrate.

In a possible embodiment of the present disclosure, the sub-pixel further includes a second conductive connection portion, a first end of the second conductive connection portion is coupled to the first electrode of the first reset transistor, and a second end of the second conductive connection portion is coupled to the first initialization signal line. An orthogonal projection of the first end of the second conductive connection portion onto the base substrate and the orthogonal projection of the shielding pattern onto the base substrate are located at a same side of the orthogonal projection of the first initialization signal line on the base substrate.

In a possible embodiment of the present disclosure, the display substrate further includes a plurality of power source lines, each power source line in the plurality of power source lines includes at least a portion extending in the second direction, and the orthogonal projection of the shielding pattern onto the base substrate overlaps with an orthogonal projection of the power source line onto the base substrate.

In a possible embodiment of the present disclosure, the plurality of initialization signal lines includes a plurality of second initialization signal lines, and each shielding pattern is coupled to a corresponding second initialization signal line. The sub-pixel further includes a light-emitting element, the sub-pixel driving circuitry further includes a second reset transistor, a first electrode of the second reset transistor is coupled to a corresponding second initialization signal line, and a second electrode of the second reset transistor is coupled to an anode of the light-emitting element.

In a possible embodiment of the present disclosure, the display substrate further includes a normal display region, a transition region and an under-screen camera region, and at least one of the normal display region, the transition region and the under-screen camera region includes the sub-pixels.

In a possible embodiment of the present disclosure, the display substrate further includes a plurality of data lines, a plurality of gate lines, a plurality of light-emission control lines and a plurality of power source lines, and the sub-pixel driving circuitry further includes a storage capacitor, a data write-in transistor, a power source control transistor and a light-emission control transistor. A gate electrode of the data write-in transistor is coupled to a corresponding gate line, a first electrode of the data write-in transistor is coupled to a corresponding data line, and a second electrode of the data write-in transistor is coupled to a first electrode of the driving transistor. A gate electrode of the power source control transistor is coupled to a corresponding light-emission control signal line, a first electrode of the power source control transistor is coupled to a power source line, and a second electrode of the power source control transistor is coupled to the first electrode of the driving transistor. A gate electrode of the light-emission control transistor is coupled to a corresponding light-emission control signal line, a first electrode of the light-emission control transistor is coupled to the second electrode of the driving transistor, and a second electrode of the light-emission control transistor is coupled to the light-emitting element in the sub-pixel. A first plate of the storage capacitor is coupled to the gate electrode of the driving transistor, and a second plate of the storage capacitor is coupled to a corresponding power source line.

In another aspect, the present disclosure provides in some embodiments a display device including the above-mentioned display substrate.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

Figure 1:
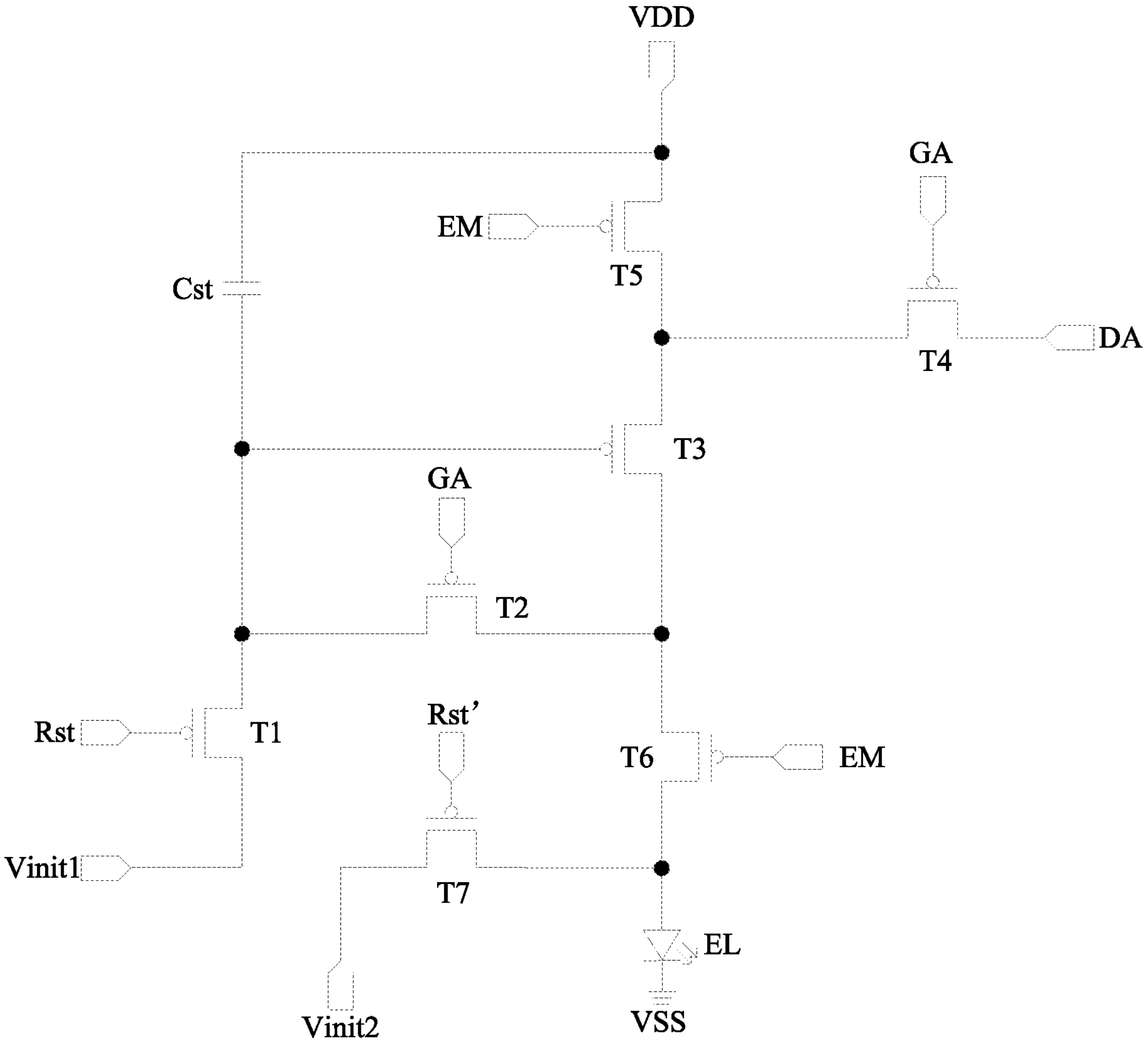
FIG. 1 is a circuit diagram of a sub-pixel driving circuitry according to one embodiment of the present disclosure.

The present disclosure will be described hereinafter in conjunction with the drawings and embodiments.

With reference to FIGS. 1, 2, 3, 4, 7, 8, 12, 13, 16 and 21, the present disclosure provides in some embodiments a display substrate, which includes a base substrate 100, and a plurality of sub-pixels 101 and a plurality of initialization signal lines (such as a first initialization signal line Vinit1) arranged on the base substrate 100. Each sub-pixel 101 in the plurality of sub-pixels 101 includes a sub-pixel driving circuitry and a shielding pattern 30, and the sub-pixel driving circuitry includes a driving transistor T3 and a compensation transistor T2. A first electrode of the compensation transistor T2 is coupled to a second electrode of the driving transistor T3, and a second electrode of the compensation transistor T2 is coupled to a gate electrode T3-*g* of the driving transistor T3. The compensation transistor T2 includes a compensation active layer 21, the compensation active layer 21 includes a first compensation channel portion 210, a second compensation channel portion 211 and a compensation connection portion 213, and the compensation connection portion 213 is coupled to the first compensation channel portion 210 and the second compensation channel portion 211. The shielding pattern 30 is coupled to a corresponding initialization signal line, and an orthogonal projection of the shielding patterns 30 onto the base substrate 100 at least partially overlaps with an orthogonal projection of the compensation connection portion 213 onto the base substrate 100.

Illustratively, the display substrate includes a plurality of sub-pixels 101, and a plurality of sub-pixel driving circuitries in the plurality of sub-pixels 101 is arranged in an array form, i.e., arranged in rows and columns. The plurality of rows of sub-pixel driving circuitries is arranged in a second direction D2, and each row of sub-pixel driving circuitries include a plurality of sub-pixel driving circuitries arranged in a first direction D1. The plurality of columns of sub-pixel driving circuitries is arranged in the first direction D1, and each column of sub-pixel driving circuitries include a plurality of sub-pixel driving circuitries arranged in the second direction D2. Illustratively, the first direction D1 intersects the second direction D2. For example, the first direction D1 includes a horizontal direction and the second direction D2 includes a longitudinal direction.

Illustratively, each sub-pixel in the plurality of sub-pixels 101 includes a sub-pixel driving circuitry and a light-emitting element EL. The sub-pixel driving circuitry is coupled to an anode of the light-emitting element EL for applying a driving signal to the light-emitting element EL so as to drive the light-emitting element EL to emit light.

Illustratively, the plurality of initialization signal lines is arranged along the second direction D2, and corresponds to the rows of sub-pixel driving circuitries respectively. Each initialization signal line includes at least a portion extending in the first direction D1.

Illustratively, the initialization signal line is used to transmit an initialization signal, e.g., a direct current signal at a stable potential.

Illustratively, the display substrate further includes a plurality of gate lines GA arranged along the second direction D2 and corresponding to the rows of sub-pixel driving circuitries respectively. Each gate line GA includes at least a portion extending in the first direction D1.

Illustratively, the gate electrode of the compensation transistor T2 is coupled to a corresponding gate line GA, the first electrode of the compensation transistor T2 is coupled to the second electrode of the driving transistor T3, and the second electrode of the compensation transistor T2 is coupled to the gate electrode T3-*g* of the driving transistor T3.

Illustratively, the compensation transistor T2 includes a double-gate transistor. The compensation transistor T2 includes a compensation active layer 21 which includes a first compensation channel portion 210, a second compensation channel portion 211 and a compensation connection portion 213. The compensation active layer 21 is also used to form the first electrode and the second electrode of the compensation transistor T2. The first compensation channel portion 210 is located between the compensation connection portion 213 and the first electrode of the compensation transistor T2. The second compensation channel portion 211 is located between the compensation connection portion 213 and the second electrode of the compensation transistor T2.

Illustratively, the conductivity of the compensation connection portion 213 is better than the conductivity of the first compensation channel portion 210 and the conductivity of the second compensating channel portion 211.

Illustratively, the shielding pattern 30 is arranged at a same layer as, or at a layer different from, the initialization signal line. When the shielding pattern 30 and the initialization signal line are arranged at different layers, the shielding pattern 30 and the initialization signal line are coupled to each other through a via hole penetrating through an insulation layer therebetween.

Illustratively, the orthogonal projection of the shielding pattern 30 onto the base substrate 100 completely covers an orthogonal projection of the compensation connection portion 213 onto the base substrate 100.

Illustratively, the orthogonal projection of the shielding pattern 30 onto the base substrate 100 does not overlap with an orthogonal projection of the data line DA onto the base substrate 100. In this way, it is able to prevent a load of the data line DA from being increased, thereby to reduce the power consumption.

Based on the above-mentioned structure of the display substrate, the shielding pattern 30 is coupled to the corresponding initialization signal line, so it is able to apply a stable initialization signal to the shielding pattern 30. The orthogonal projection of the shielding pattern 30 onto the base substrate 100 at least partially overlaps with the orthogonal projection of the compensation connection portion 213 onto the base substrate 100, so it is able to eliminate the influence of a signal surrounding the compensation connection portion 213 on the compensation connection portion 213 is eliminated through the shielding pattern 30, and ensure the stable characteristics of the compensation transistor T2, thereby to ensure the operation performance of the sub-pixel driving circuitry and the display quality of the display substrate.

Furthermore, according to the display substrate in the embodiments of the present disclosure, the initialization signal line extends along the first direction D1, the orthogonal projection of the initialization signal line onto the base substrate 100 and the orthogonal projection of the compensation connection portion 213 onto the base substrate 100 are arranged along the second direction D2, and the initialization signal line is arranged close to the compensation connection portion 213. The shielding pattern 30 is coupled to the initialization signal line, and the compensation connection portion 213 is shielded by the shielding pattern 30, so it is able to reduce a size of the shielding pattern 30 to the greatest extent, and reduce the difficulty in the layout of the shielding pattern 30, thereby to ensure a shielding effect in the case of a limited sub-pixel layout space in a high-resolution display product.

As shown in FIG. 3, FIG. 5, FIG. 6, FIG. 9, FIG. 12, FIG. 14, FIG. 15 and FIG. 18, in some embodiments of the present disclosure, each shielding pattern 30 and the corresponding initialization signal line are of a one-piece structure.

Illustratively, the shielding pattern 30 and the initialization signal line are made of a second gate metal layer in the display substrate. In this way, it is able to provide an appropriate distance between the shielding pattern 30 and the compensation connection portion 213, thereby to prevent the operation performance of the compensation transistor T2 from being adversely affected due to a too small distance, and prevent the shielding effect from being adversely affected due to a too large distance.

Based on the above, it is able to ensure the connection performance between the shielding pattern 30 and the initialization signal line. In addition, it is able to form the shielding pattern 30 and the initialization signal line through a single patterning process, thereby to simplify the manufacture of the display substrate, and reduce the manufacture difficulty of the display substrate.

As shown in FIG. 3, FIG. 4, FIG. 6, FIG. 9 and FIG. 10, in some embodiments of the present disclosure, each initialization signal line includes at least a portion that extends in the first direction D1 and the shielding pattern 30 includes at least a portion that extends in the second direction D2 intersecting the first direction D1. The sub-pixel driving circuitry further includes a first conductive connection portion 11, a first end 110 of the first conductive connection portion 11 is coupled to the second electrode of the compensation transistor T2, and a second end 111 of the first conductive connection portion 11 is coupled to the gate electrode T3-*g* of the driving transistor T3. In the first direction D1, the orthogonal projection of the shielding pattern 30 onto the base substrate 100, an orthogonal projection of the second compensation channel portion 211 onto the base substrate 100, and an orthogonal projection of the first end 110 of the first conductive connection portion 11 onto the base substrate 100 are arranged sequentially.

Illustratively, the first conductive connection portion 11 includes a strip-like pattern extending in the second direction D2.

Illustratively, the orthogonal projection of the shielding pattern 30 onto the base substrate 100 and the orthogonal projection of the first compensation channel portion 210 onto the base substrate 100 are arranged in the second direction D2.

Based on the above, the shielding pattern 30 includes at least a portion extending along the second direction D2, and in the first direction D1, the orthogonal projection of the shielding pattern 30 onto the base substrate 100, the orthogonal projection of the second compensation channel portion 211 onto the base substrate 100, and the orthogonal projection of the first end 110 of the first conductive connection portion 11 onto the base substrate 100 are arranged in sequence. In this way, it is able to reduce a size of the shielding pattern 30 to the greatest extent, thereby to enable the shielding pattern 30 with a minimum size to be coupled to the initialization signal line and shield the compensation connection portion 213.

As shown in FIGS. 3, 5, 6 and 9, in some embodiments of the present disclosure, the shielding pattern 30 includes a strip-like pattern extending in the second direction D2, a first end 301 of the shielding pattern 30 is coupled to the initialization signal line, an orthogonal projection of a second end 302 of the shielding pattern 30 onto the base substrate 100 at least partially overlaps with the orthogonal projection of the compensation connection portion 213 onto the base substrate 100. In the first direction D1, a width of the second end 302 of the shielding pattern 30 is larger than a width of the first end 301 of the shielding pattern 30.

Based on the above, along the first direction D1, the width of the second end 302 of the shielding pattern 30 is greater than the width of the first end 301 of the shielding pattern 30, so it is able to reduce a layout space occupied by the first end 301 of the shielding pattern 30 and shield the compensation connection portion 213 through the second end 302 of the shielding pattern 30, thereby to reduce the layout difficulty of the shielding pattern 30.

As shown in FIGS. 3 to 7 and 9, in some embodiments of the present disclosure, the sub-pixel 101 further includes a connection pattern 27, the sub-pixel driving circuitry further includes a first reset transistor T1, and a second electrode of the first reset transistor T1 is coupled to the second electrode of the compensation transistor T2 through the connection pattern 27. The orthogonal projection of the shielding pattern 30 onto the base substrate 100 does not overlap with an orthogonal projection of the connection pattern 27 on the base substrate 100.

Illustratively, the display substrate further includes a plurality of reset lines Rst arranged in the second direction D2, and each reset line Rst includes at least a portion extending in the first direction D1. The plurality of reset lines Rst corresponds to the plurality of rows of sub-pixel driving circuitries respectively. The gate electrode of the first reset transistor T1 is coupled to a corresponding reset line Rst.

Illustratively, the connection pattern 27 is made of an active layer in the display substrate. The connection pattern 27, the second electrode of the first reset transistor T1, and the second electrode of the compensation transistor T2 are of a one-piece structure.

Illustratively, the connection pattern 27 includes a strip-like structure extending in the second direction D2.

Illustratively, the orthogonal projection of the connection pattern 27 onto the base substrate 100 and the orthogonal projection of the first conductive connection portion 11 onto the base substrate 100 are arranged in the second direction D2.

Based on the above, the orthogonal projection of the shielding pattern 30 onto the base substrate 100 does not overlap with the orthogonal projection of the connection pattern 27 onto the base substrate 100, so it is able to reduce the size of the shielding pattern 30 to the greatest extent, thereby to enable the shielding pattern 30 with a minimum size to be coupled to the initialization signal line and to shield the compensation connection portion 213.

As shown in FIGS. 3 to 7 and 9, in some embodiments of the present disclosure, the orthogonal projection of the shielding pattern 30 onto the base substrate 100 and the orthogonal projection of the connection pattern 27 onto the base substrate 100 are arranged in the first direction D1.

Based on the above, it is able to reduce the layout difficulty of the shielding pattern 30, and minimize the size of the shielding pattern 30, thereby to enable the shielding pattern 30 with a minimum size to be coupled to the initialization signal line and shield the compensation connection portion 213.

As shown in FIG. 3, FIG. 5, FIG. 6, FIG. 7 and FIG. 9, in some embodiments of the present disclosure, the sub-pixel 101 further includes a light-emitting element EL, the sub-pixel driving circuitry further includes a second reset transistor T7, and a second electrode of the second reset transistor T7 is coupled to an anode of the light-emitting element EL. The second reset transistor T7 includes a second reset active layer 26, and an orthogonal projection of the second reset active layer 26 onto the base substrate 100 and the orthogonal projection of the shielding pattern 30 onto the base substrate 100 are arranged in the second direction D2.

Illustratively, a gate electrode of the second reset transistor T7 is coupled to a same reset line as the gate electrode of the adjacent first reset transistor T1 in the sub-pixel driving circuitry in the second direction D2. The second reset transistor T7 is used to reset the anode of the light-emitting element EL.

Illustratively, the second reset active layer 26 includes a strip-like pattern extending in the second direction D2.

An orthogonal projection of the second reset active layer 26 onto the base substrate 100 and the orthogonal projection of the shielding pattern 30 onto the base substrate 100 are arranged along the second direction D2, so that a width of the sub-pixel driving circuitry in the first direction D1 is not increased due to the shielding pattern 30. In this way, it is able to provide the display substrate with a high resolution.

As shown in FIG. 3, FIG. 5, FIG. 6 and FIG. 9, in some embodiments of the present disclosure, the plurality of initialization signal lines includes a plurality of first initialization signal lines Vinit1, each shielding pattern 30 is coupled to a corresponding first initialization signal lines Vinit1, and a first electrode of the first reset transistor T1 is coupled to the first initialization signal line Vinit1 The display substrate further includes a plurality of second initialization signal lines Vinit2, a first electrode of the second reset transistor T7 is coupled to a corresponding second initialization signal line Vinit2, and the orthogonal projection of the second reset active layer 26 onto the base substrate 100 does not overlap with an orthogonal projection of the first initialization signal line Vinit1 onto the base substrate 100.

Illustratively, the orthogonal projection of the first initialization signal line Vinit1 onto the base substrate 100 is arranged between the orthogonal projection of the shielding pattern 30 onto the base substrate 100 and the orthogonal projection of the second initialization signal line Vinit2 onto the base substrate 100.

Illustratively, the orthogonal projection of the shielding pattern 30 onto the base substrate 100 does not overlap with the orthogonal projection of the second initialization signal line Vinit2 onto the base substrate 100.

Illustratively, the first initialization signal line Vinit1 is used to provide a first initialization signal, the second initialization signal line Vinit2 is used to provide a second initialization signal, both the first initialization signal and the second initialization signal are DC signals each at a stable potential.

Illustratively, the plurality of second initialization signal lines Vinit2 is arranged in the second direction D2, each second initialization signal lines Vinit2 includes at least a portion extending in the first direction D1, and the plurality of second initialization signal lines Vinit2 corresponds to the plurality of rows of sub-pixel driving circuitries respectively.

Based on the above, the orthogonal projection of the second reset active layer 26 onto the base substrate 100 does not overlap with the orthogonal projection of the first initialization signal line Vinit1 onto the base substrate 100, so it is able to reduce a length of the sub-pixel driving circuitry in the second direction D2.

As shown in FIGS. 3, 5, 6, 9 and 10, in some embodiments of the present disclosure, the sub-pixel 101 further includes a second conductive connection portion 12, a first end 120 of the second conductive connection portion 12 is coupled to the first electrode of the first reset transistor T1, and a second end 121 of the second conductive connection portion 12 is coupled to the first initialization signal line Vinit1. An orthogonal projection of the first end 120 of the second conductive connection portion 12 onto the base substrate 100 is located at a first side of the orthogonal projection of the first initialization signal line Vinit1 onto the base substrate 100, the orthogonal projection of the shielding pattern 30 onto the base substrate 100 is located at a second side of the orthogonal projection of the first initialization signal line Vinit1 onto the base substrate 100, and the first side is opposite to the second side in the second direction D2.

Illustratively, the second conductive connection portion 12 includes a strip-like pattern extending in the second direction D2.

Illustratively, the orthogonal projection of the second conductive connection portion 12 onto the base substrate 100 does not overlap with the orthogonal projection of the reset line Rst onto the base substrate 100.

Based on the above, the second conductive connection portion 12 and the shielding pattern 30 are located at two sides of the first initialization signal line Vinit1 respectively, so it is able to reduce the layout difficulty of the sub-pixel driving circuitry in the first direction D1.

Figure 3:
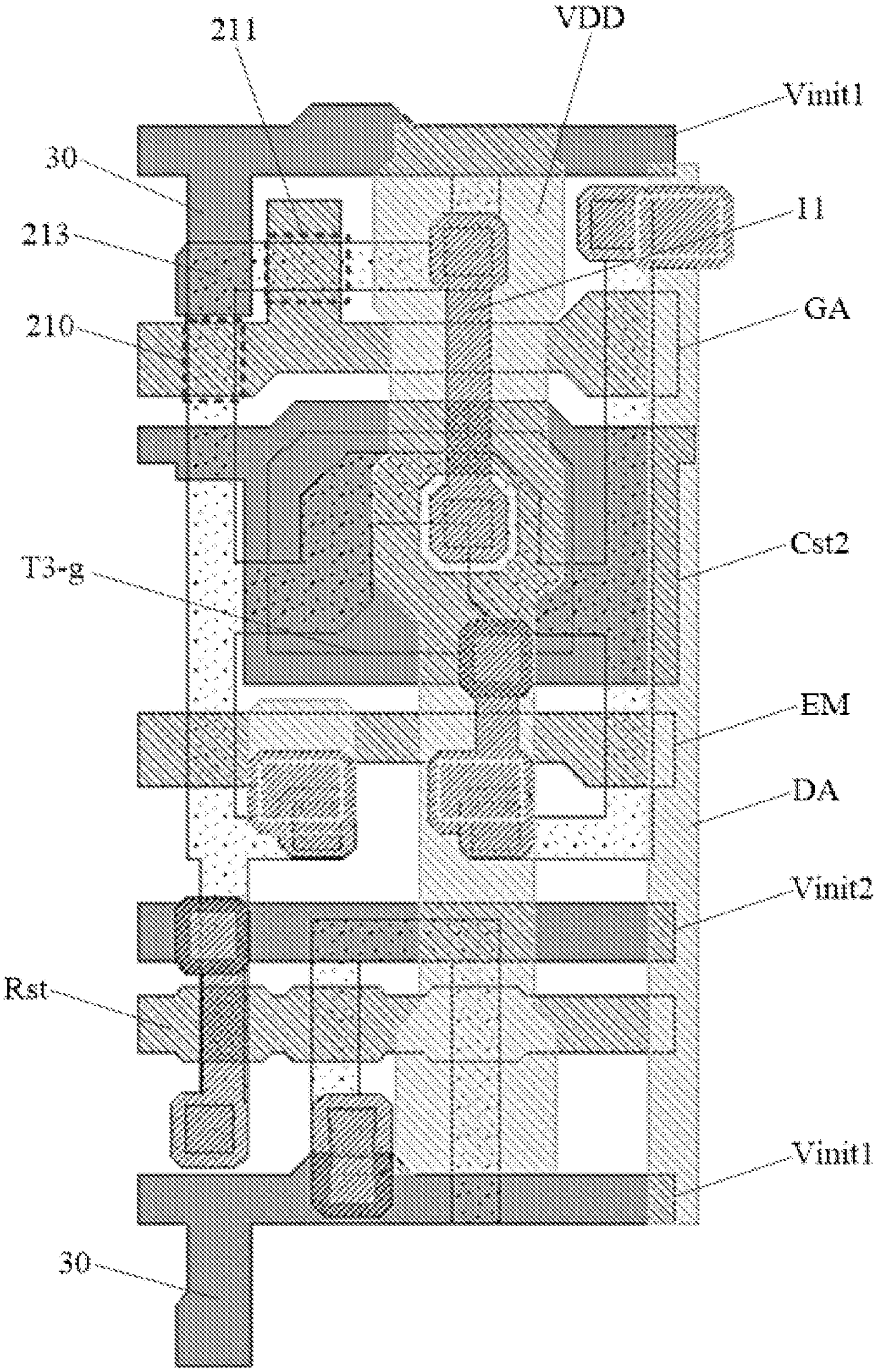
FIG. 3 is a schematic view showing the layout of the sub-pixel driving circuitry according to one embodiment of the present disclosure.
Figure 4:
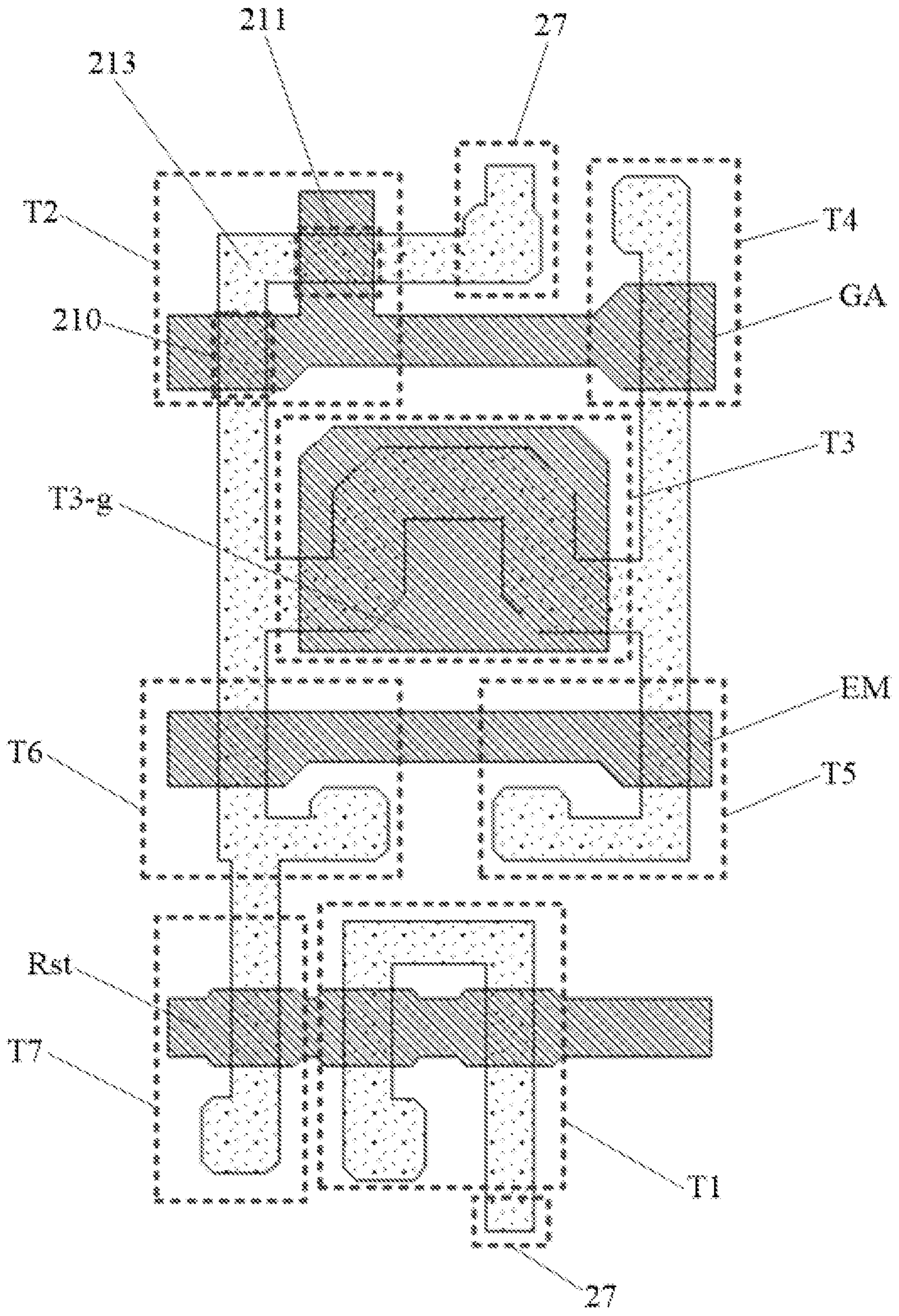
FIG. 4 is a schematic view showing the layout of an active layer and a first gate metal layer in FIG. 3.
Figure 5:
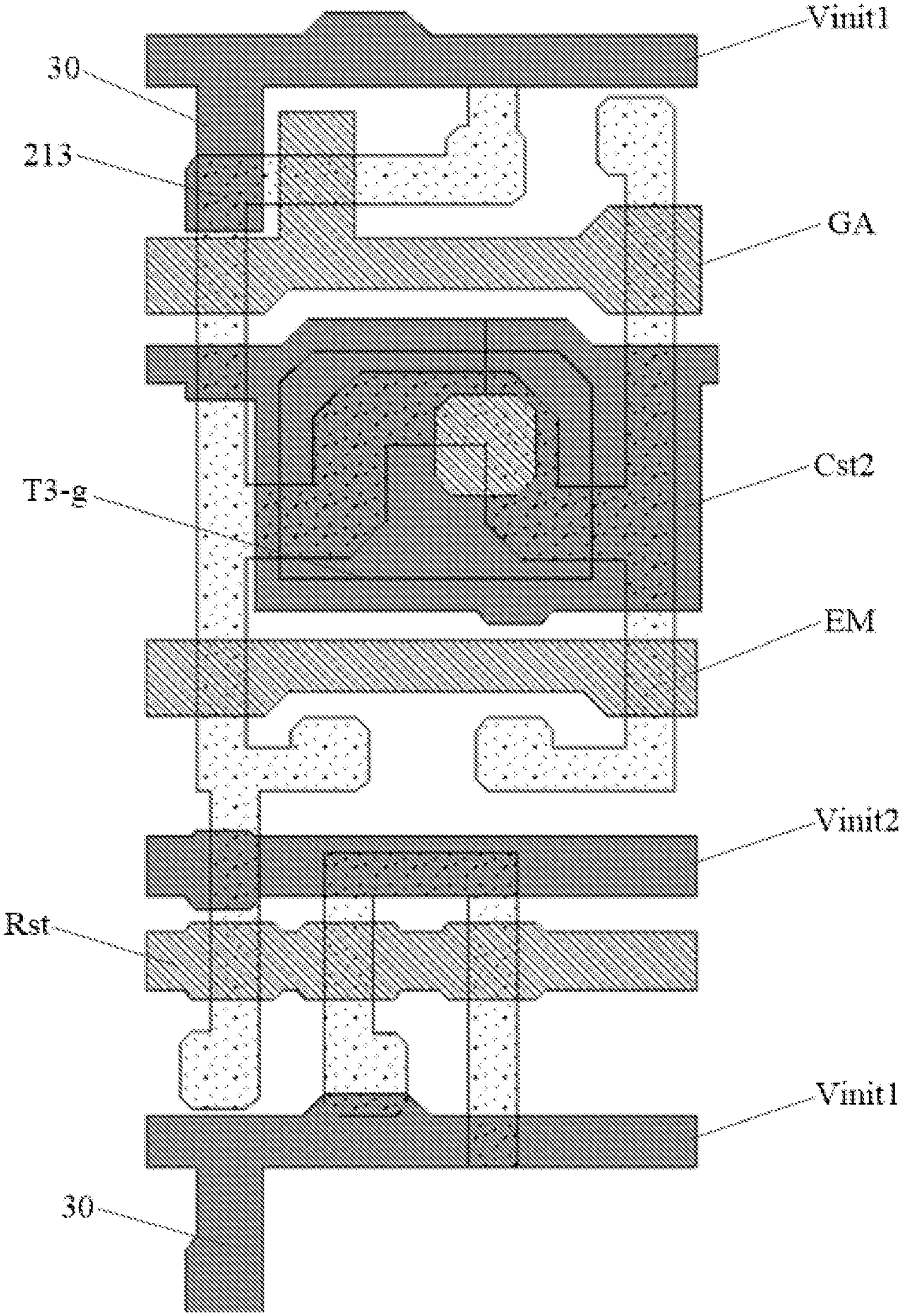
FIG. 5 is a schematic view showing the layout of the active layer, the first gate metal layer and a second gate metal layer in FIG. 3.
Figure 6:
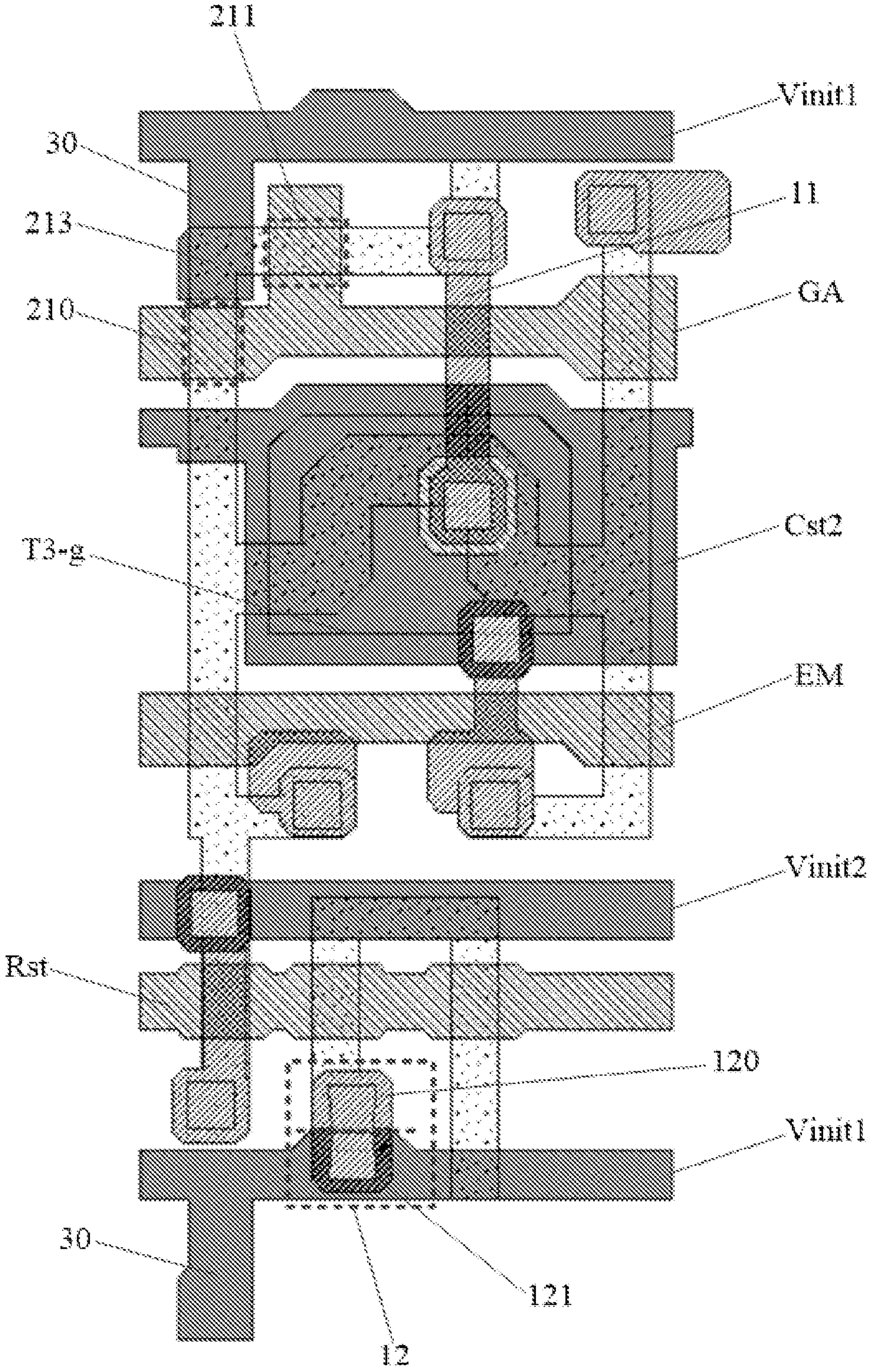
FIG. 6 is a schematic view showing the layout of a first source/drain metal layer on the basis of FIG. 5.
Figure 11:
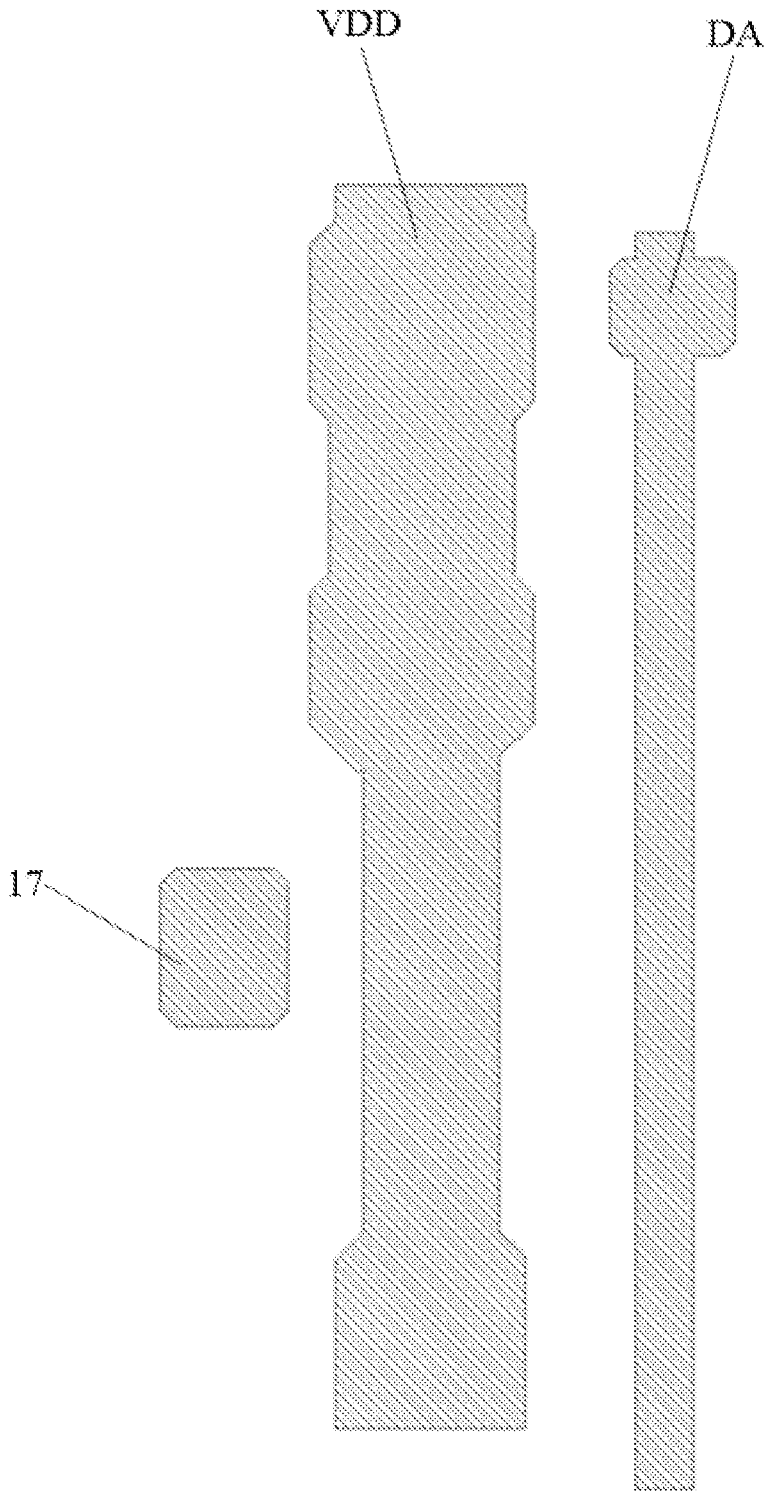
FIG. 11 is a schematic view showing the layout of a second source/drain metal layer in FIG. 3.

As shown in FIGS. 3 and 11, in some embodiments of the present disclosure, the display substrate further includes a plurality of power source lines VDD, each power source line in the plurality of power source lines VDD includes at least a portion extending in the second direction D2, and the orthogonal projection of the shielding pattern 30 onto the base substrate 100 does not overlap with an orthogonal projection of the power source line VDD onto the base substrate 100.

Illustratively, the plurality of power source lines VDD is arranged in the first direction D1 and corresponds to the plurality of columns of sub-pixel driving circuitries respectively. Each power source line in the plurality of power source lines VDD includes at least a portion extending in the second direction D2, and it is used to transmit a stable power source signal.

Illustratively, the orthogonal projection of the shielding pattern 30 onto the base substrate 100 and the orthogonal projection of the power source line VDD onto the base substrate 100 are arranged in the first direction D1.

Based on the above, the orthogonal projection of the shielding pattern 30 onto the base substrate 100 does not overlap with the orthogonal projection of the power source line VDD onto the base substrate 100, so it is able to reduce the size of the shielding pattern 30, thereby to reduce the layout difficulty of the sub-pixel driving circuitry.

As shown in FIG. 12, FIG. 13, FIG. 15, FIG. 17, FIG. 18 and FIG. 19, in some embodiments of the present disclosure, each initialization signal line includes at least a portion that extends in a first direction D1, and the shielding pattern 30 includes at least a portion that extends in a second direction D2 intersecting the first direction D1. The sub-pixel driving circuitry further includes a first conductive connection portion 11, a first end 110 of the first conductive connection portion 11 is coupled to the second electrode of the compensation transistor T2, and a second end 111 of the first conductive connection portion 11 is coupled to the gate electrode T3-*g* of the driving transistor T3. At least a portion of the orthogonal projection of the shielding pattern 30 onto the base substrate 100 and an orthogonal projection of the first conductive connection portion 11 on the base substrate 100 are arranged in the second direction D2.

Figure 18:
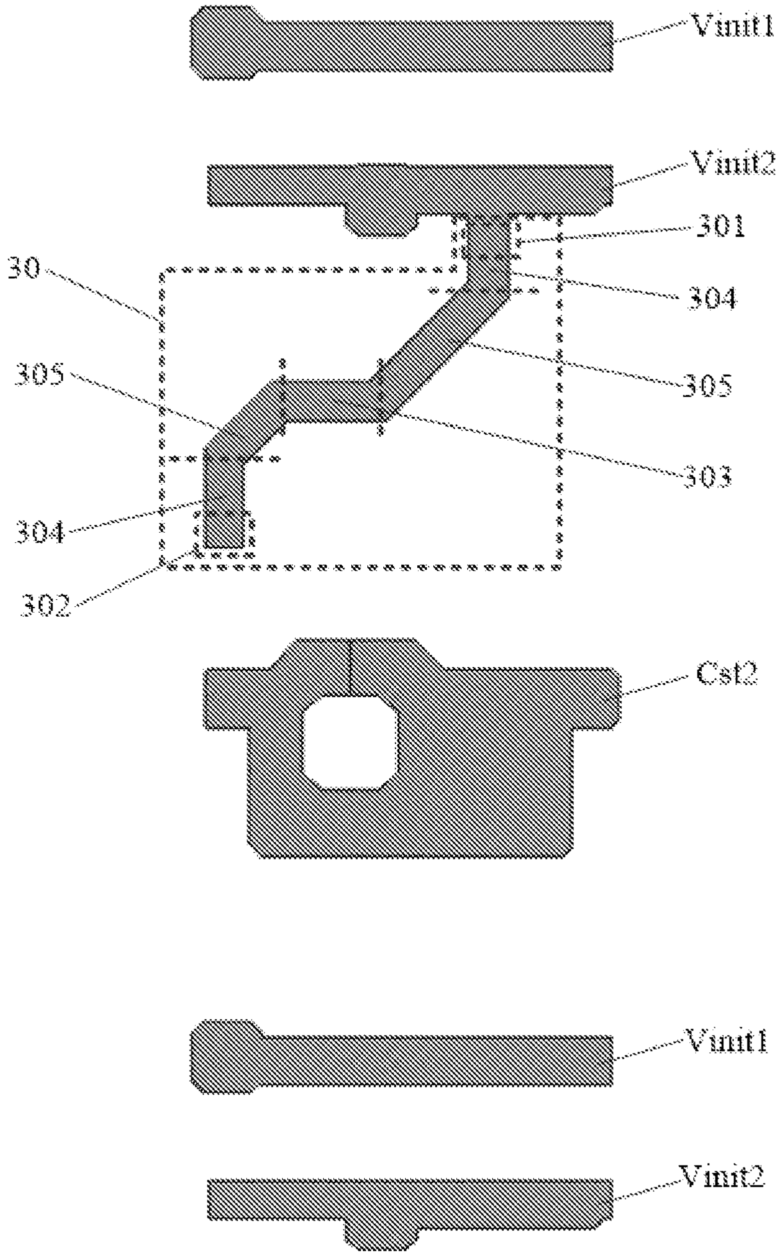
FIG. 18 is a schematic view showing the layout of the second gate metal layer in FIG. 12.

As shown in FIG. 18, the shielding pattern 30 includes a first shielding portion 303 extending in the first direction D1, a second shielding portion 304 extending in the second direction D2, and a third shielding portion 305 extending in a third direction. The third direction intersects both the first direction D1 and the second direction D2.

Illustratively, the first conductive connection portion 11 includes a first conductive portion extending in the second direction D2 and a second conductive portion extending in the third direction.

Illustratively, the first conductive connection portion 11 has a uniform width in a direction perpendicular to its extension direction.

Based on the above, at least a portion of the orthogonal projection of the shielding pattern 30 onto the base substrate 100 and the orthogonal projection of the first conductive connection portion 11 onto the base substrate 100 are arranged in the second direction D2, it is able to make full use of the limited layout space, thereby to facilitate the high-resolution display.

As shown in FIGS. 12 to 15, in some embodiments of the present disclosure, the sub-pixel 101 further includes a connection pattern 27, the sub-pixel driving circuitry further includes a first reset transistor T1, and a second electrode of the first reset transistor T1 is coupled to the second electrode of the compensation transistor T2 through the connection pattern 27. The orthogonal projection of the shielding pattern 30 onto the base substrate 100 partially overlaps with an orthogonal projection of the connection pattern 27 onto the base substrate 100.

The shielding pattern 30 is at a stable potential, and when the orthogonal projection of the shielding pattern 30 onto the base substrate 100 overlaps with the orthogonal projection of the connection pattern 27 onto the base substrate 100, it is able to enhance the potential stability of the second electrode of the first reset transistor T1 and the second electrode of the compensation transistor T2.

Figure 12:
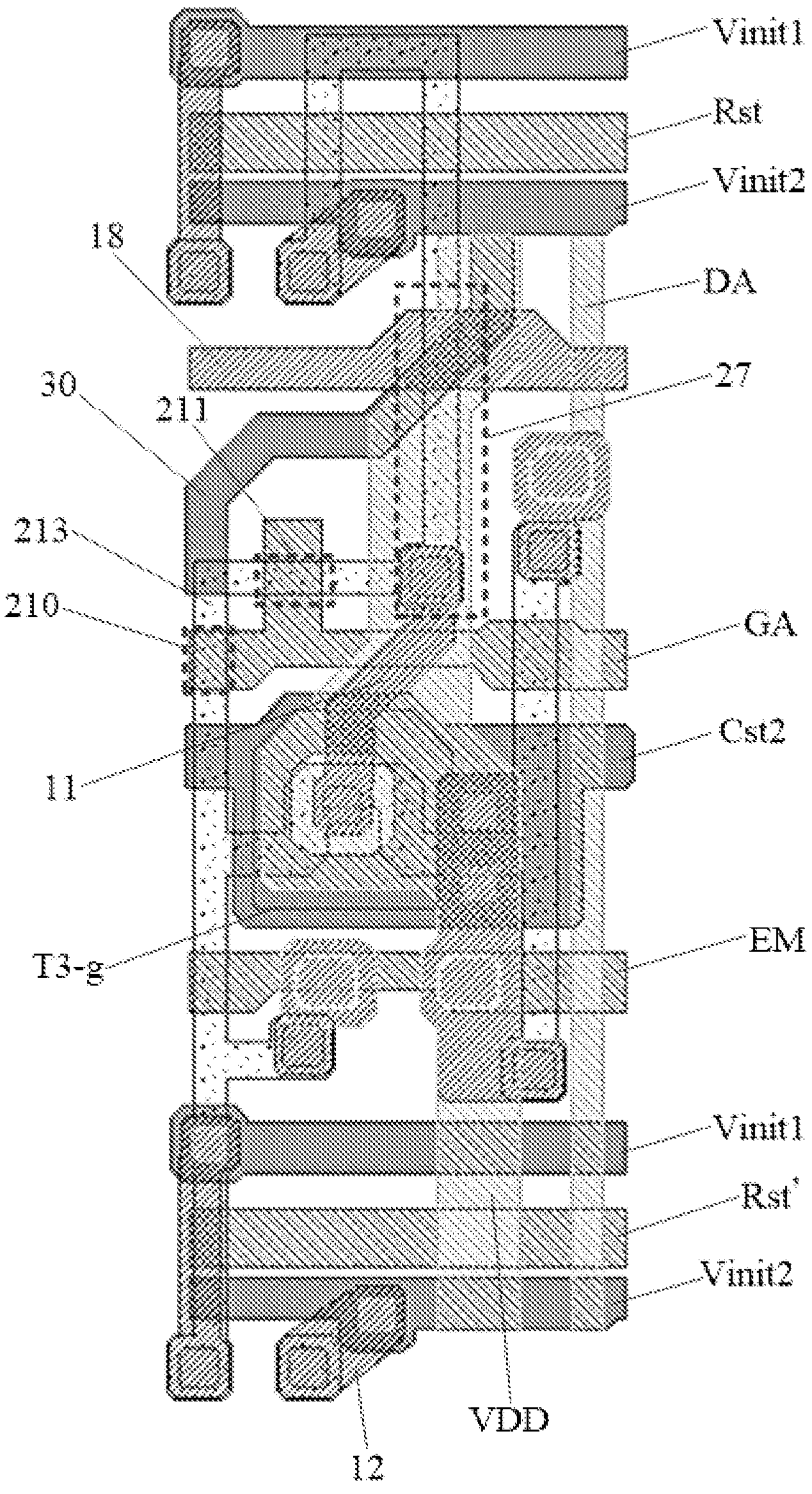
FIG. 12 is another schematic view showing the layout of the sub-pixel driving circuitry according to one embodiment of the present disclosure.
Figure 13:
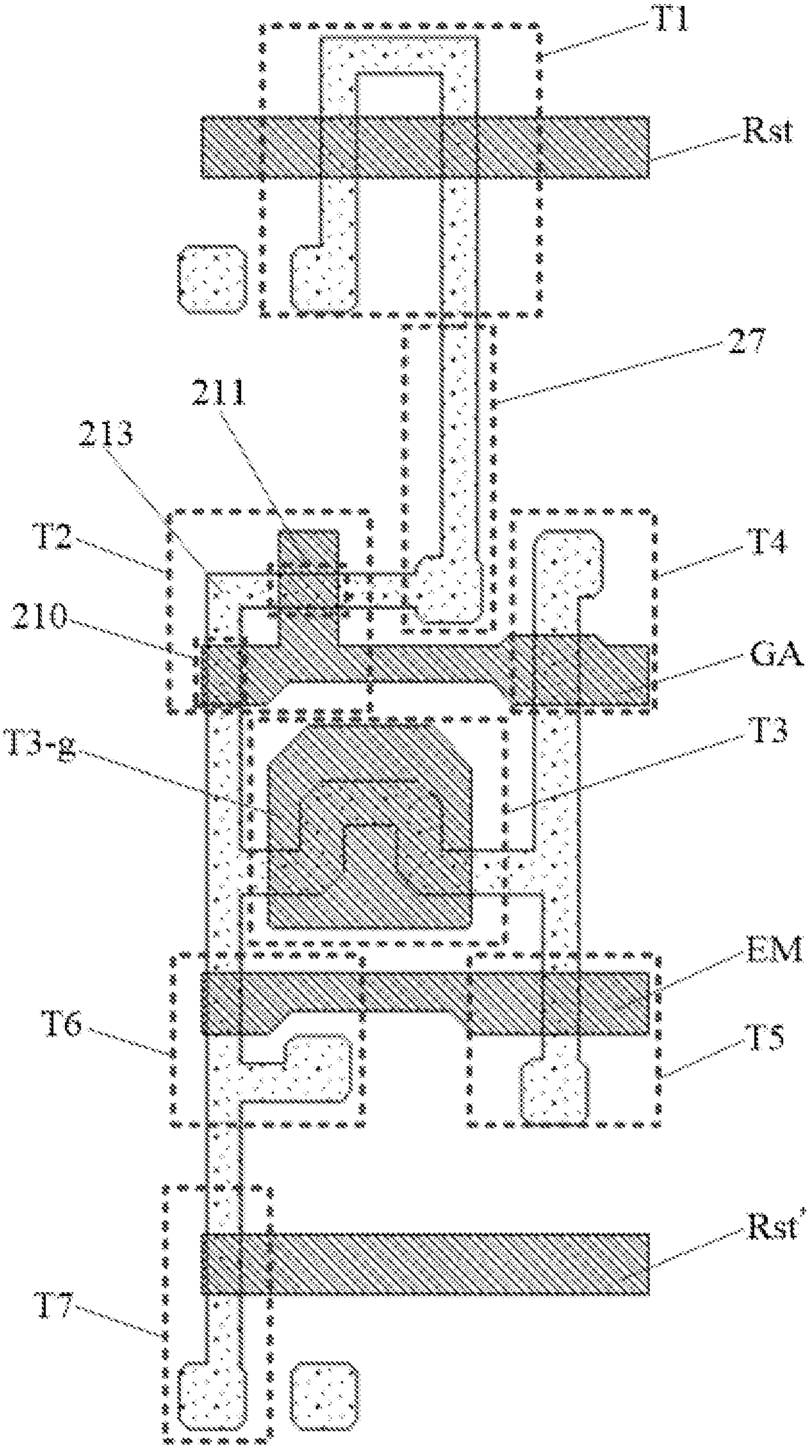
FIG. 13 is a schematic view showing the layout of the active layer and the first gate metal layer in FIG. 12.
Figure 14:
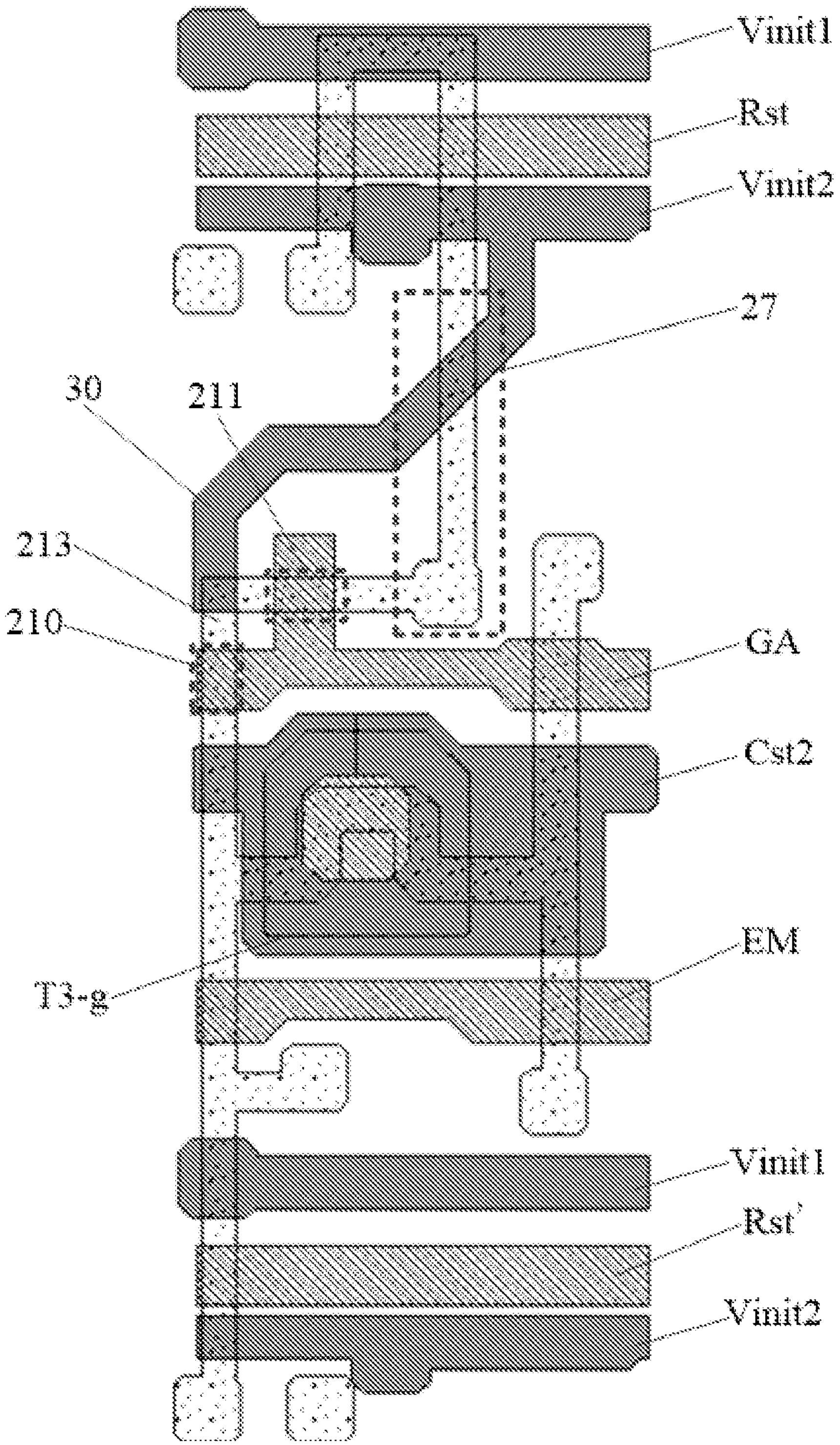
FIG. 14 is a schematic view showing the layout of the active layer, the first gate metal layer and the second gate metal layer in FIG. 12.
Figure 16:
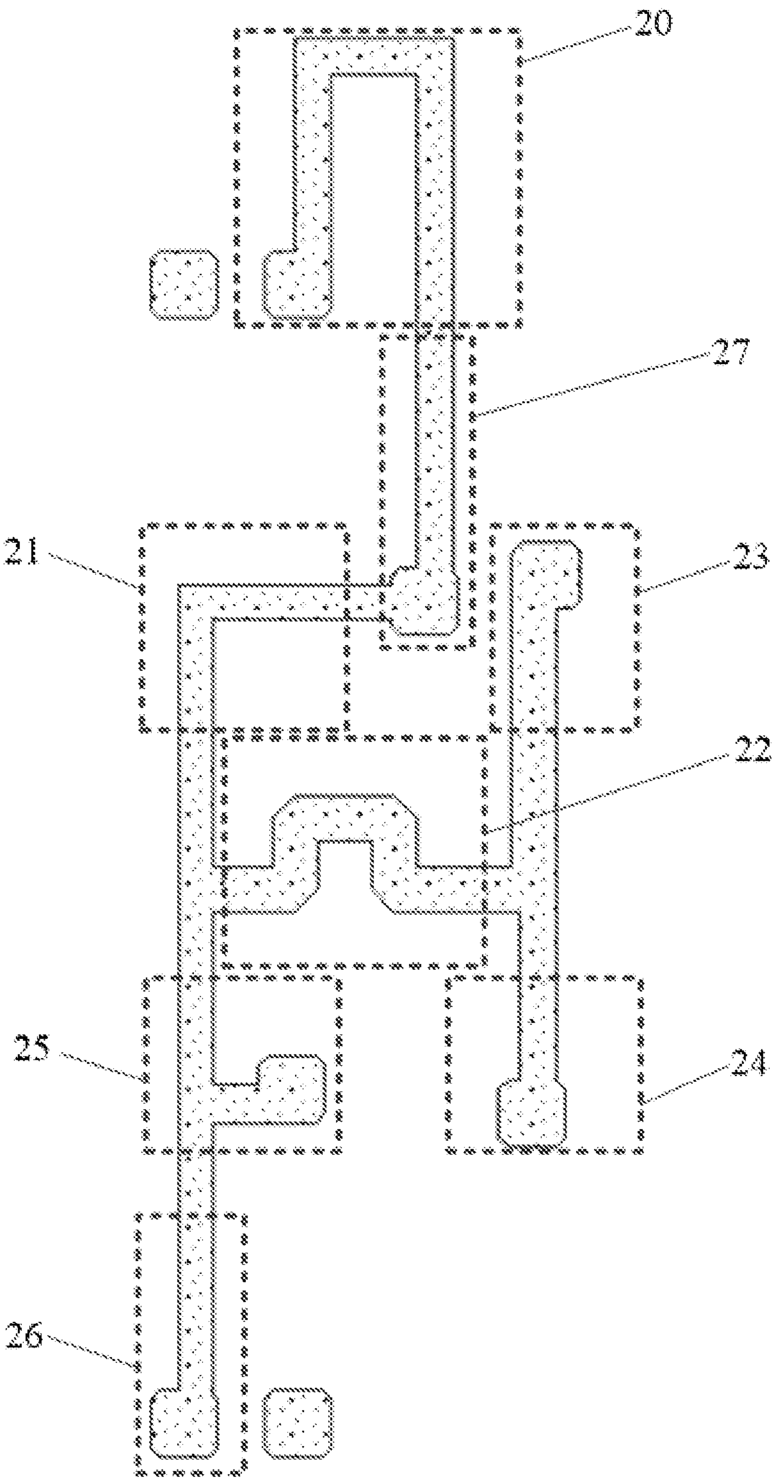
FIG. 16 is a schematic view showing the layout of the active layer in FIG. 12.

As shown in FIGS. 12, 16 and 18, in some embodiments of the present disclosure, the sub-pixel 101 further includes a light-emitting element EL, the sub-pixel driving circuitry further includes a second reset transistor T7, a second electrode of the second reset transistor T7 is coupled to an anode of the light-emitting element EL, and the second reset transistor T7 includes a second reset active layer 26. A first end 301 of the shielding pattern 30 is coupled to the initialization signal line, and an orthogonal projection of a second end 302 of the shielding pattern 30 onto the base substrate 100 at least partially overlaps with the orthogonal projection of the compensation connection portion 213 onto the base substrate 100. An orthogonal projection of a first end 301 of the shielding pattern 30 onto the base substrate 100 and at least a portion of an orthogonal projection of the second reset active layer 26 onto the base substrate 100 are arranged along the first direction D1, and an orthogonal projection of the second end 302 of the shielding pattern 30 onto the base substrate 100 and the orthogonal projection of the second reset active layer 26 onto the base substrate 100 are arranged in the second direction D2.

Illustratively, the sub-pixel driving circuitry may be applied to a display substrate including an under-screen camera region. The sub-pixel driving circuitry is applied to a display region DR in the display substrate, or a transition region between the display region DR and the under-screen camera region in the display substrate, or the under-screen camera region.

Illustratively, when the sub-pixel driving circuitry is located in the transition region and used to drive the anode in the under-screen display region, the display substrate further includes a connection line 18. The connection line 18 is made of a first source/drain metal layer, and coupled to a data line DA that avoids the under-screen display region, so as to apply a data signal to the data line DA. Illustratively, the connection line 18 includes a portion extending in the first direction D1, and an orthogonal projection of the connection line 18 onto the base substrate 100 at least partially overlaps with the orthogonal projection of the shielding pattern 30 onto the base substrate 100.

Based on the above, the orthogonal projection of the first end 301 of the shielding pattern 30 onto the base substrate 100 and at least a portion of the orthogonal projection of the second reset active layer 26 onto the base substrate 100 are arranged in the first direction D1, and the orthogonal projection of the second end 302 of the shielding pattern 30 on the base substrate 100 and the orthogonal projection of the second reset active layer 26 on the base substrate 100 are arranged along the second direction D2. In this way, it is able to reduce the width of the shielding pattern 30 in the first direction D1, and reduce the length of the shielding pattern 30 in the second direction D2, thereby to reduce the layout difficulty of the sub-pixel 101, and achieve the high-resolution display.

In some embodiments of the present disclosure, the plurality of initialization signal lines includes a plurality of first initialization signal lines Vinit1, and the shielding pattern 30 is coupled to a corresponding first initialization signal lines Vinit1. A first electrode of the first reset transistor T1 is coupled to the first initialization signal line Vinit1. The display substrate further includes a plurality of second initialization signal lines Vinit2, and a first electrode of the second reset transistor T7 is coupled to a corresponding second initialization signal line Vinit2. The orthogonal projection of the second reset active layer 26 onto the base substrate 100 partially overlaps with an orthogonal projection of the first initialization signal line Vinit1 onto the base substrate 100.

Figure 15:
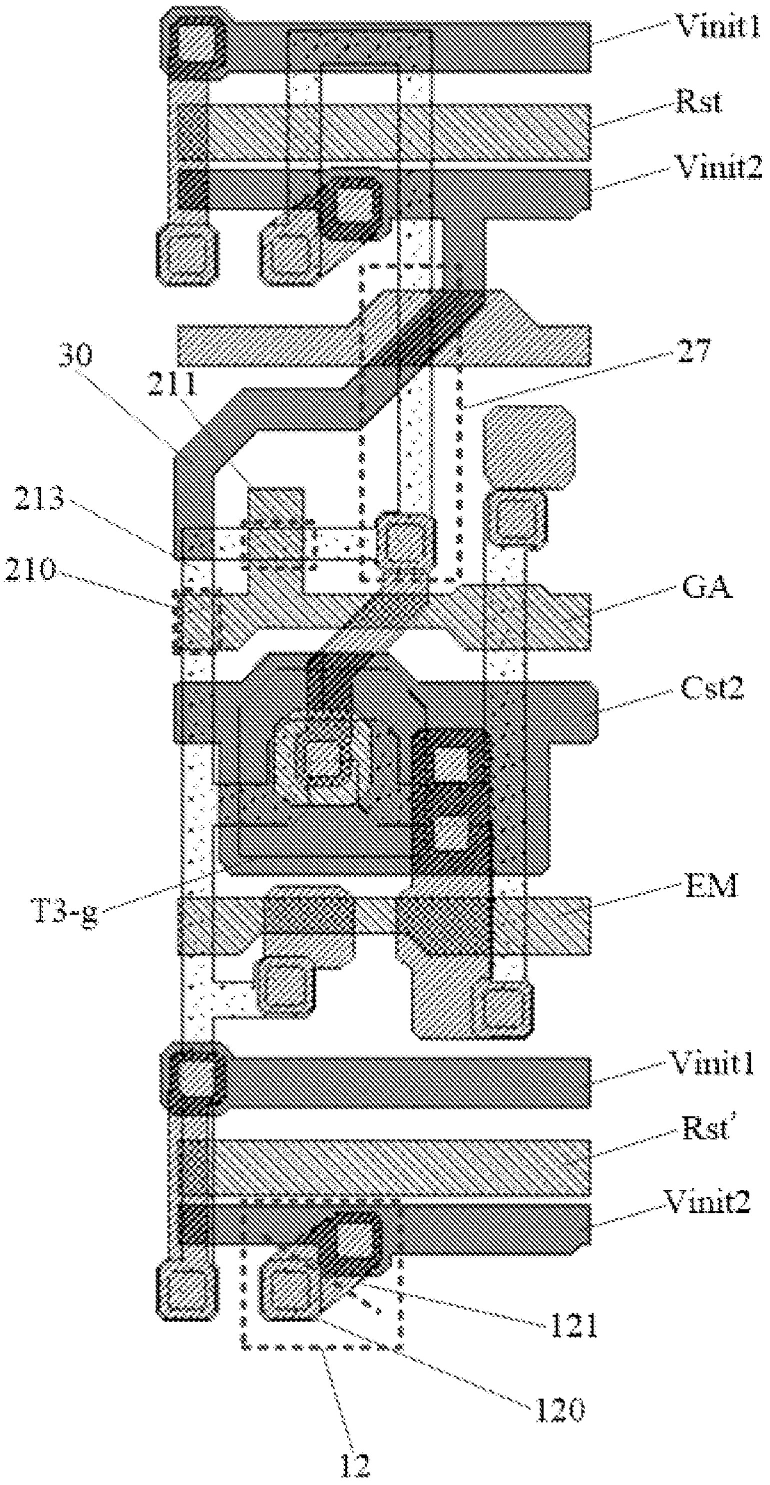
FIG. 15 is a schematic view showing the layout of the first source/drain metal layer on the basis of FIG. 14.

As shown in FIG. 15, in some embodiments of the present disclosure, the sub-pixel 101 further includes a second conductive connection portion 12, a first end 120 of the second conductive connection portion 12 is coupled to the first electrode of the first reset transistor T1, and a second end 121 of the second conductive connection portion 12 is coupled to the first initialization signal line Vinit1. An orthogonal projection of the first end 120 of the second conductive connection portion 12 onto the base substrate 100 and the orthogonal projection of the shielding pattern 30 onto the base substrate 100 are located at a same side of the orthogonal projection of the first initialization signal line Vinit1 onto the base substrate 100.

Illustratively, the second conductive connection portion 12 includes at least a portion extending in the third direction.

Illustratively, the orthogonal projection of the first end 120 of the second conductive connection portion 12 onto the base substrate 100 is arranged between the orthogonal projection of the shielding pattern 30 onto the base substrate 100 and the orthogonal projection of the second reset active layer 26 onto the base substrate 100.

Based on the above, the orthogonal projection of the first end 120 of the second conductive connection portion 12 onto the base substrate 100 and the orthogonal projection of the shielding pattern 30 onto the base substrate 100 are both located at the same side of the orthogonal projection of the first initialization signal line Vinit1 onto the base substrate 100, so it is able to reduce the width of the sub-pixel 101 in the second direction D2.

Figure 20:
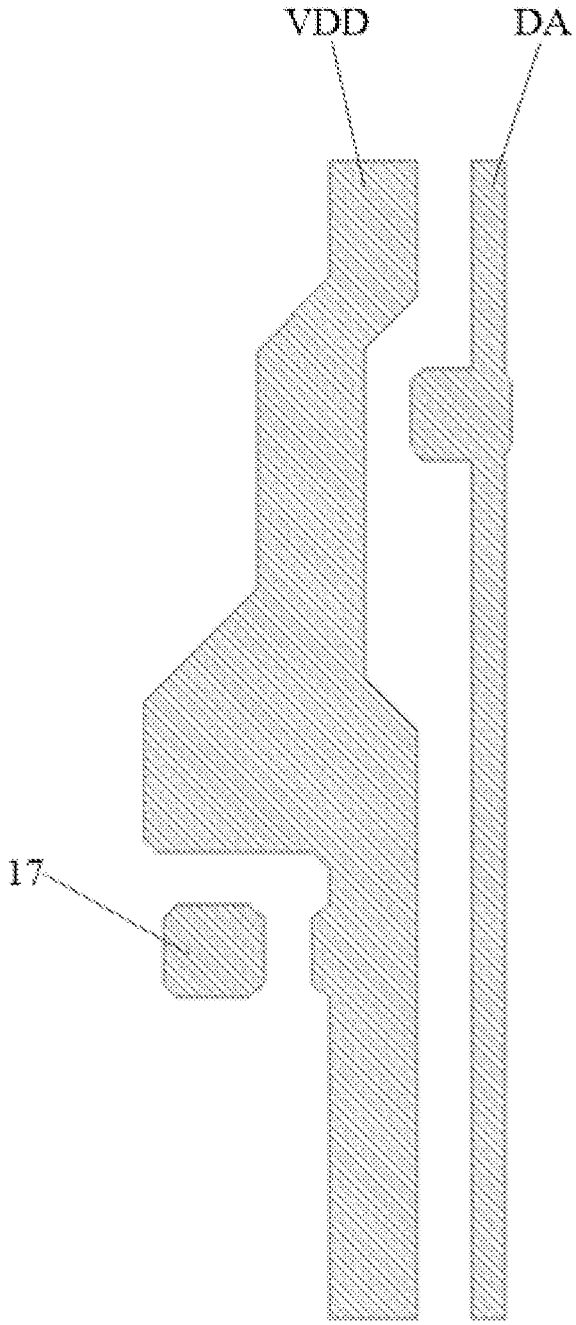
FIG. 20 is a schematic view showing the layout of the second source/drain metal layer in FIG. 12.
Figure 21:
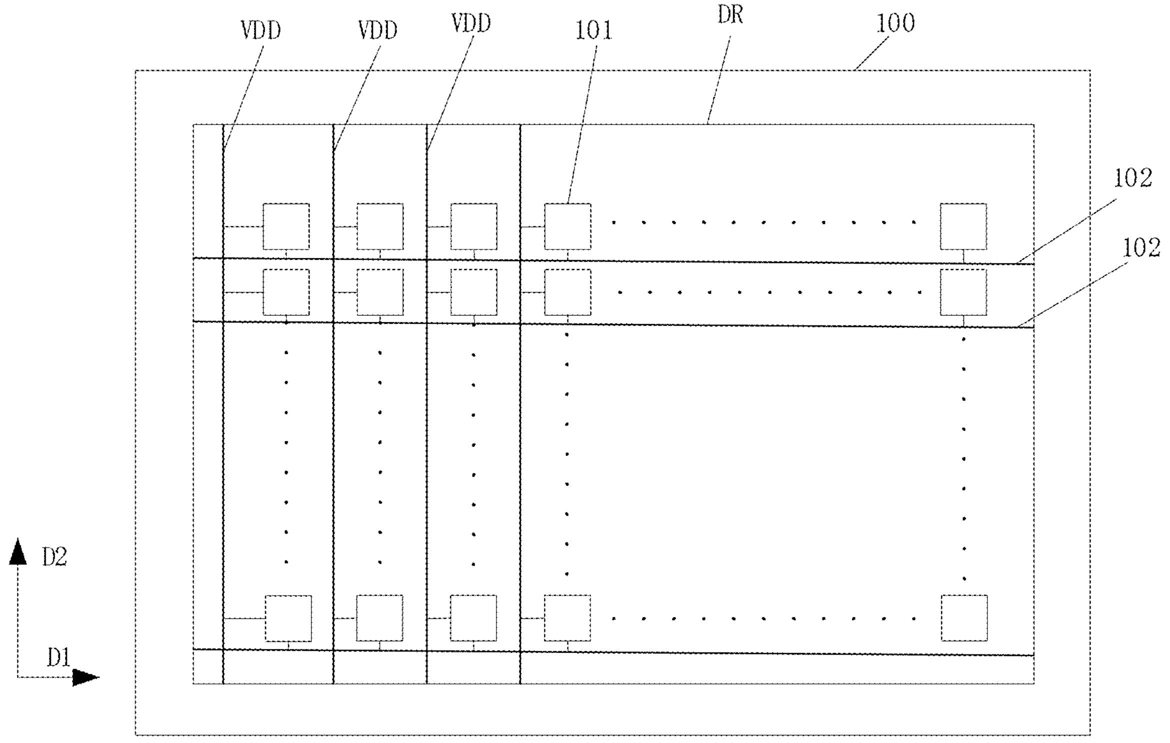
FIG. 21 is a schematic view showing display substrate.

As shown in FIGS. 12 and 20, in some embodiments of the present disclosure, the display substrate further includes a plurality of power source lines VDD, each power source line in the plurality of power source lines VDD includes at least a portion extending in the second direction D2, and the orthogonal projection of the shielding pattern 30 onto the base substrate 100 overlaps with an orthogonal projection of the power source line VDD on the base substrate 100.

Based on the above, it is able to reduce the layout difficulty of the shielding pattern 30.

As shown in FIGS. 12 to 15, in some embodiments of the present disclosure, the plurality of initialization signal lines includes a plurality of second initialization signal lines Vinit2, and each shielding pattern 30 is coupled to a corresponding second initialization signal line Vinit2. The sub-pixel 101 further includes a light-emitting element EL, the sub-pixel driving circuitry further includes a second reset transistor T7, a first electrode of the second reset transistor T7 is coupled to a corresponding second initialization signal line Vinit2, and a second electrode of the second reset transistor T7 is coupled to an anode of the light-emitting element EL.

When the shielding pattern 30 is coupled to the second initialization signal line Vinit2 such that a second initialization signal from the second initialization signal line Vinit2 is applied to the shielding pattern 30, it is also able to achieve an excellent shielding effect.

In some embodiments of the present disclosure, the display substrate further includes a display region DR, a transition region, and an under-screen camera region, and at least one of the display region DR, the transition region and the under-screen camera region includes the sub-pixel 101.

The above-mentioned sub-pixel structure is applied to at least one of the display region DR, the transition region, and the under-screen camera region, or a display product that does not include any under-screen camera region. In particular, for a display product including the under-screen camera region, in order to achieve the high-resolution display, the layout space occupied by the sub-pixel 101 is very small. Through the sub-pixels 101 with the above-mentioned structure, it is able to meet the requirement on the display product including the under-screen camera region.

When the display product includes the above-mentioned sub-pixels 101, it is able to reduce the layout difficulty of the sub-pixels 101, thereby to achieve the high-resolution display.

As shown in FIGS. 1-4, 12 and 13, in some embodiments of the present disclosure, the display substrate further includes a plurality of data lines DA, a plurality of gate lines GA, a plurality of light-emission control lines EM and a plurality of power source lines VDD. The sub-pixel driving circuitry further includes a storage capacitor Cst, a data write-in transistor T4, a power source control transistor T5 and a light-emission control transistor T6. A gate electrode of the data write-in transistor T4 is coupled to a corresponding gate line GA, a first electrode of the data write-in transistor T4 is coupled to a corresponding data line DA, and a second electrode of the data write-in transistor T4 is coupled to a first electrode of the driving transistor T3. A gate electrode of the power source control transistor T5 is coupled to a corresponding light-emission control signal line, a first electrode of the power source control transistor T5 is coupled to a corresponding power source line VDD, and a second electrode of the power source control transistor T5 is coupled to the first electrode of the driving transistor T3. A gate electrode of the light-emission control transistor T6 is coupled to a corresponding light-emission control signal line, a first electrode of the light-emission control transistor T6 is coupled to a second electrode of the driving transistor T3, and a second electrode of the light-emission control transistor T6 is coupled to a light-emitting element EL included in the sub-pixel 101.

As shown in FIGS. 8, 9, 17 and 18, a first plate Cst1 of the storage capacitor Cst is coupled to the gate electrode T3-*g* of the driving transistor T3, and a second plate Cst2 of the storage capacitor Cst is coupled to a corresponding power source line VDD.

Illustratively, the plurality of data lines DA corresponds to the plurality of columns of the sub-pixel driving circuitries respectively, the plurality of power source lines VDD corresponds to the plurality of columns of sub-pixel driving circuitries respectively, the plurality of light-emission control lines EM corresponds to the plurality of rows of sub-pixel driving circuitries respectively, and the plurality of gate lines corresponds to the plurality of rows of sub-pixel driving circuitries respectively.

More specifically, the sub-pixel driving circuitry includes a first reset transistor T1, a compensation transistor T2, a driving transistor T3, a data write-in transistor T4, a power source control transistor T5, a light-emission control transistor T6, a second reset transistor T7, and a storage capacitor Cst.

Figure 2:
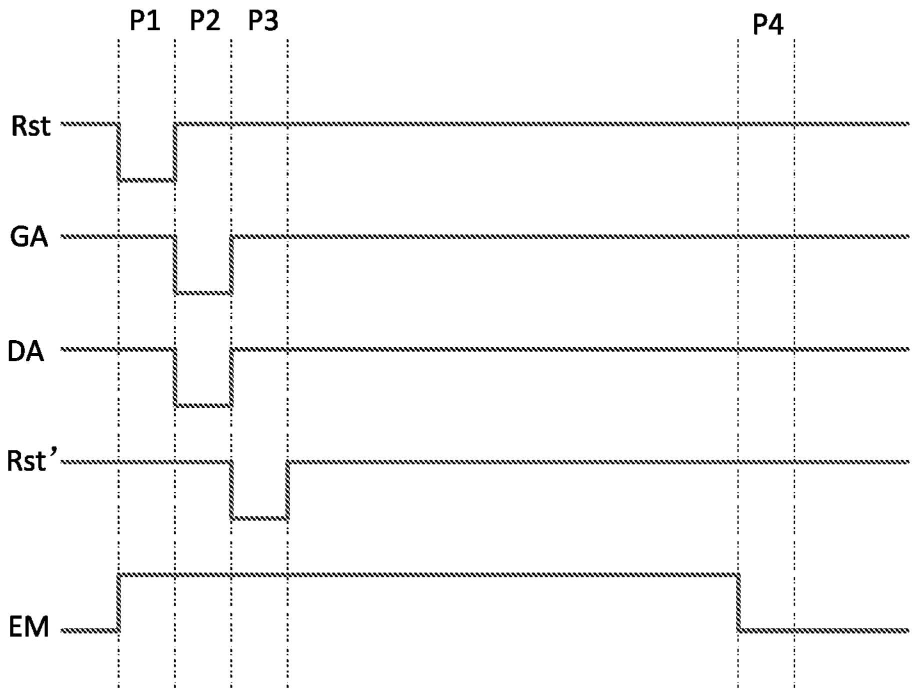
FIG. 2 is a sequence diagram of the sub-pixel driving circuitry according to one embodiment of the present disclosure.

As shown in FIGS. 1 and 2, during the operation of the sub-pixel driving circuitry, each operation cycle includes a first reset period P1, a write-in compensation period P2, a second reset period P3 and a light-emitting period P4.

Within the first reset period P1, the reset signal inputted by the reset line Rst is at an active level, so as to turn on the first reset transistor T1. The first initialization signal transmitted by the first initialization signal line Vinit1 is applied to the gate electrode T3-*g* of the driving transistor T3, so that a gate-to-source voltage Vgs maintained on the driving transistor T3 is cleared, and thereby the gate electrode T3-*g* of the driving transistor T3 is reset.

Within the write-in compensation period P2, the reset signal is at a non-active level, so as to turn off the first reset transistor T1. A gate scanning signal inputted by the gate line GA is at an active level, so as to turn on the compensation transistor T2 and the data write-in transistor T4. A data signal is written into the data line DA and transmitted to the first electrode of the driving transistor T3 through the data write-in transistor T4. In addition, the compensation transistor T2 and the data write-in transistor T4 are turned on, so that the driving transistor T3 forms a diode structure. Through the cooperation of the compensation transistor T2, the driving transistor T3 and the data write-in transistor T4, it is able to compensate for a threshold voltage of the driving transistor T3. When a compensation time period is long enough, a potential at the gate electrode T3-*g* of the driving transistor T3 is controlled to be Vdata+Vth, where Vdata represents a voltage of the data signal and Vth represents the threshold voltage of the driving transistor T3.

Within the second reset period P3, the gate scanning signal is at a non-active level, so as to turn off the compensation transistor T2 and the data write-in transistor T4. A reset signal inputted by a reset line Rst coupled to the sub-pixels 101 in a next row is at an active level, so as to turn on the second reset transistor T7. An initialization signal inputted by the second initialization signal line Vinit2 is applied to the anode of the light-emitting element EL, so as to control the light-emitting element EL not to emit light. A cathode of the light-emitting element EL is configured to receive a negative power source signal VSS.

Within the light-emitting time period P4, a light-emission control signal written into the light-emission control line EM is at an active level, so as to turn on the power source control transistor T5 and the light-emission control transistor T6, thereby to apply a power source signal from the power source line VDD to the first electrode of the driving transistor T3. In addition, the gate electrode T3-*g* of the driving transistor T3 is maintained at Vdata+Vth, so the driving transistor T3 is turned on. The gate-to-source voltage of the driving transistor T3 is Vdata+Vth-VDD, where VDD is a voltage of the power source signal. A leakage current generated in accordance with the gate-to-source voltage flows to the anode of a corresponding light-emitting element EL, so as to drive the light-emitting element EL to emit light.

The display substrate includes an active layer, a first gate insulation layer, a first gate metal layer, a second gate insulation layer, a second gate metal layer, an interlayer insulation layer, a first source/drain metal layer, a first planarization layer, a second source/drain metal layer, a second planarization layer, an anode layer, a pixel definition layer, a light emitting functional layer, a cathode layer and an encapsulation layer laminated on one another on the base substrate 100 along a direction away from the base substrate 100. The display substrate may further includes a passivation layer.

Figure 7:
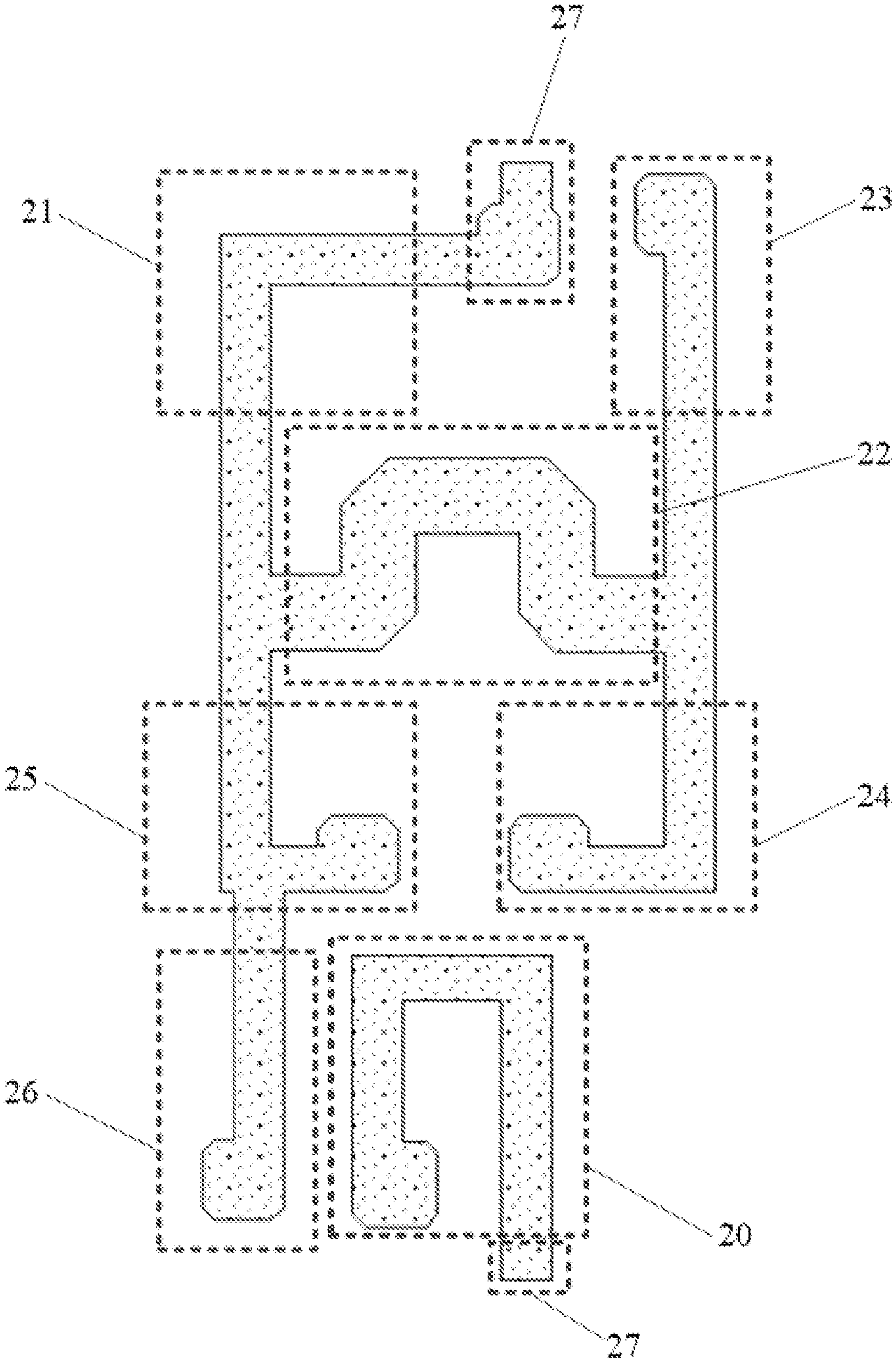
FIG. 7 is a schematic view showing the layout of the active layer in FIG. 3.

As shown in FIGS. 7 and 16, the active layer is used to form the connection pattern 27, the first reset active layer 20 of the first reset transistor T1, the compensation active layer 21 of the compensation transistor T2, a driving active layer 22 of the driving transistor T3, a data write-in active layer 23 of the data write-in transistor T4, a power source control active layer 24 of the power source control transistor T5, a light-emission control active layer 25 of the light-emission control transistor T6, the second reset active layer 26 of the second reset transistor T7, and other conductive structures.

Figure 8:
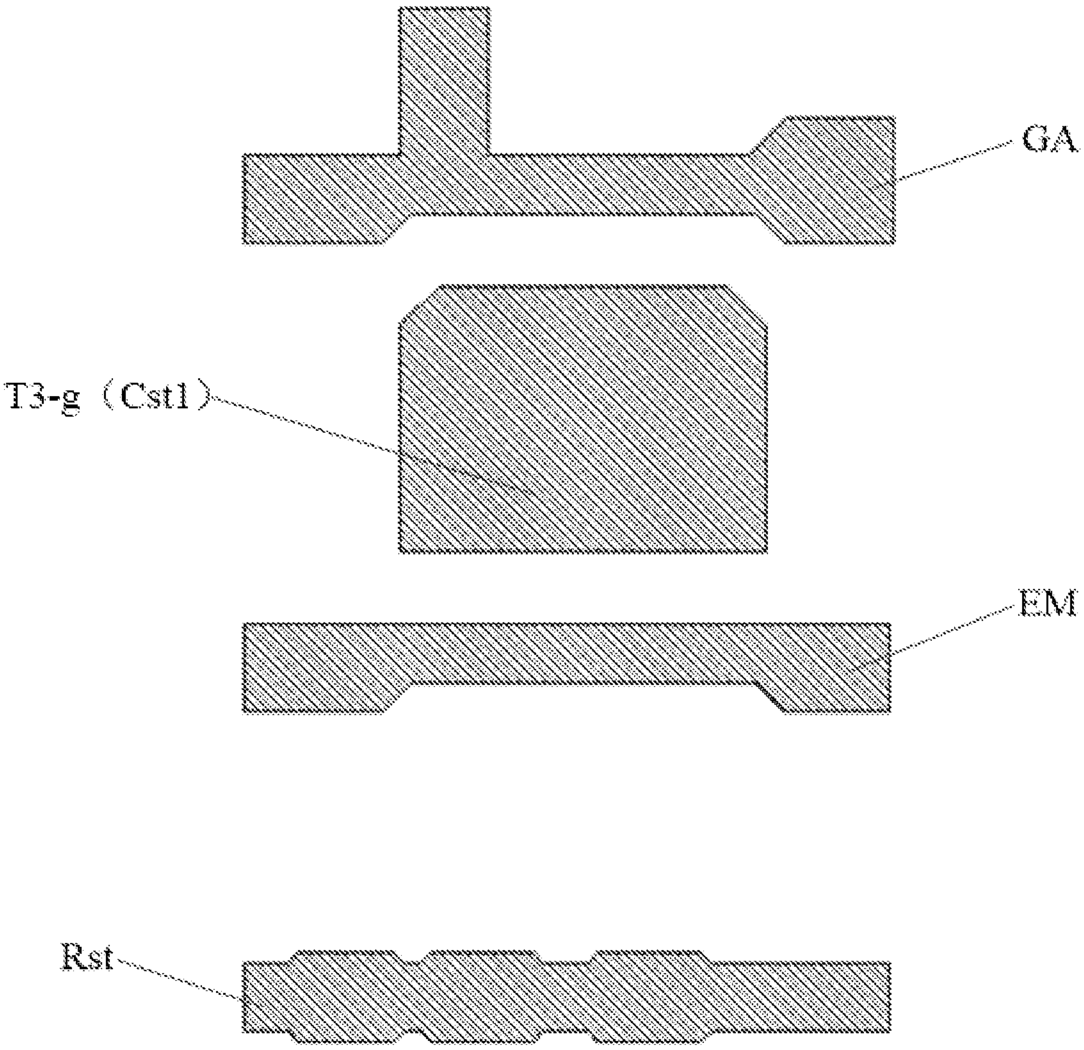
FIG. 8 is a schematic view showing the layout of the first gate metal layer in FIG. 3.
Figure 17:
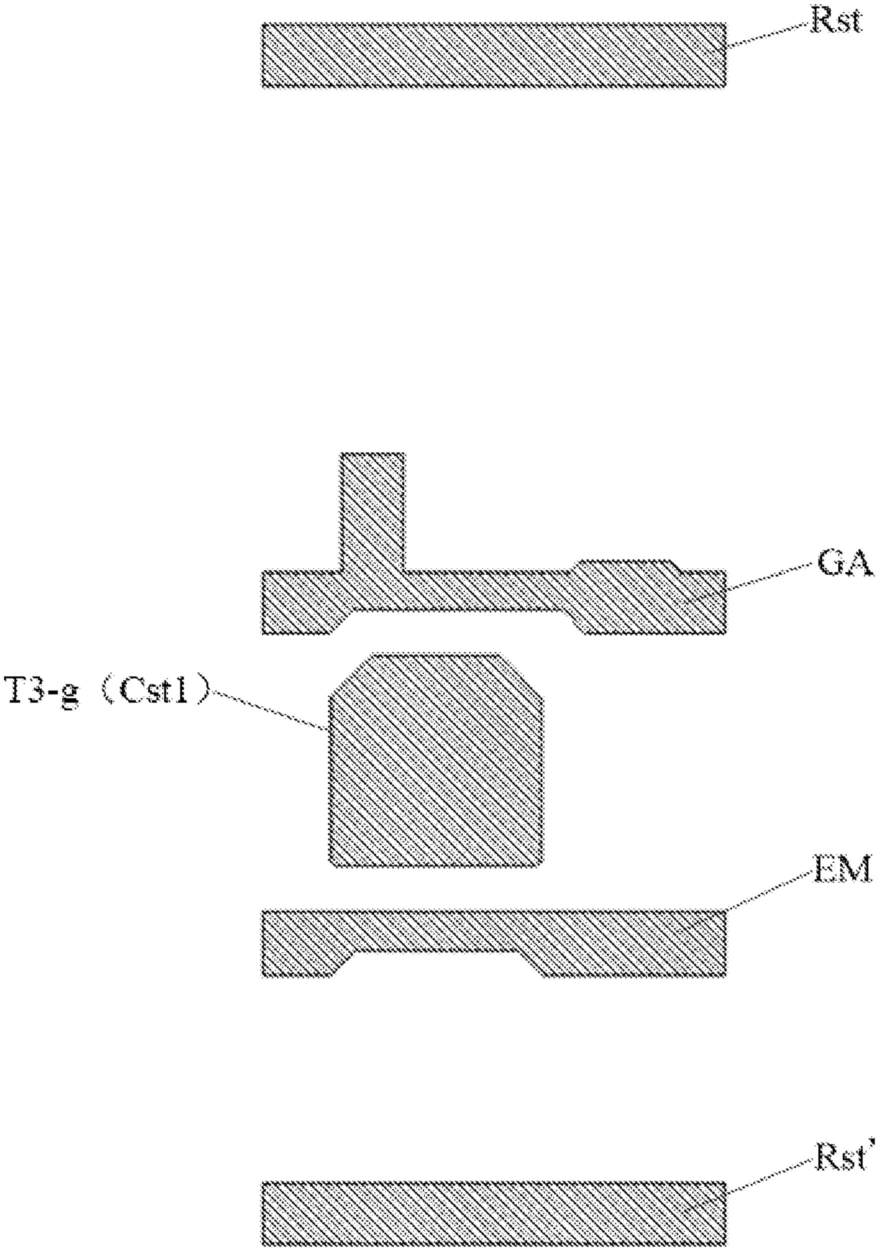
FIG. 17 is a schematic view showing the layout of the first gate metal layer in FIG. 12.

As shown in FIGS. 8 and 17, the first gate metal layer is used to form the reset line Rst, the gate line GA, the light-emission control line EM, and the gate electrode of each transistor.

Figure 9:
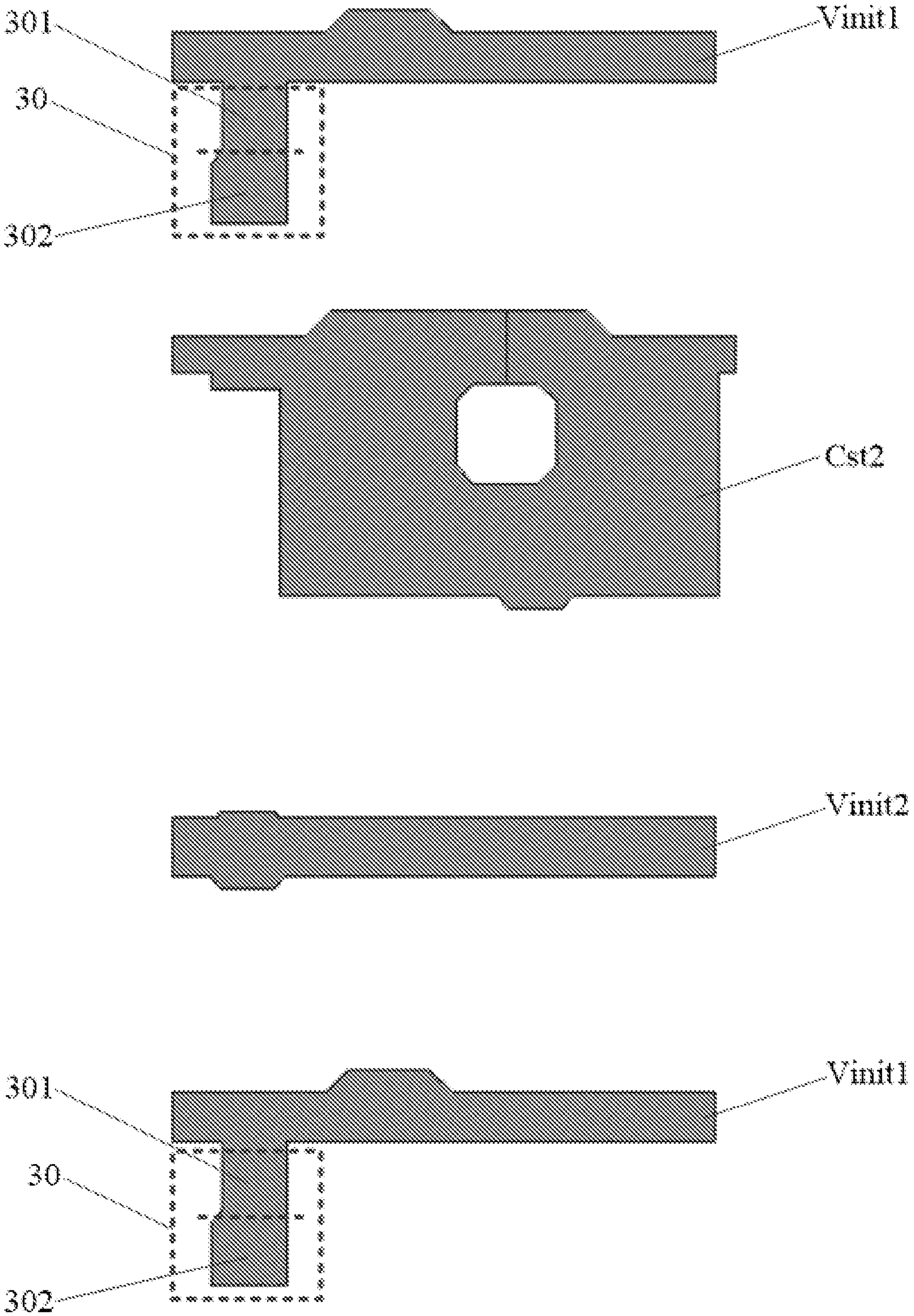
FIG. 9 is a schematic view showing the layout of the second gate metal layer in FIG. 3.

As shown in FIGS. 9 and 18, the second gate metal layer is used to form the first initialization signal line Vinit1, the second initialization signal line Vinit2, the shielding pattern, and the second plate Cst2 of the storage capacitor Cst.

Figure 10:
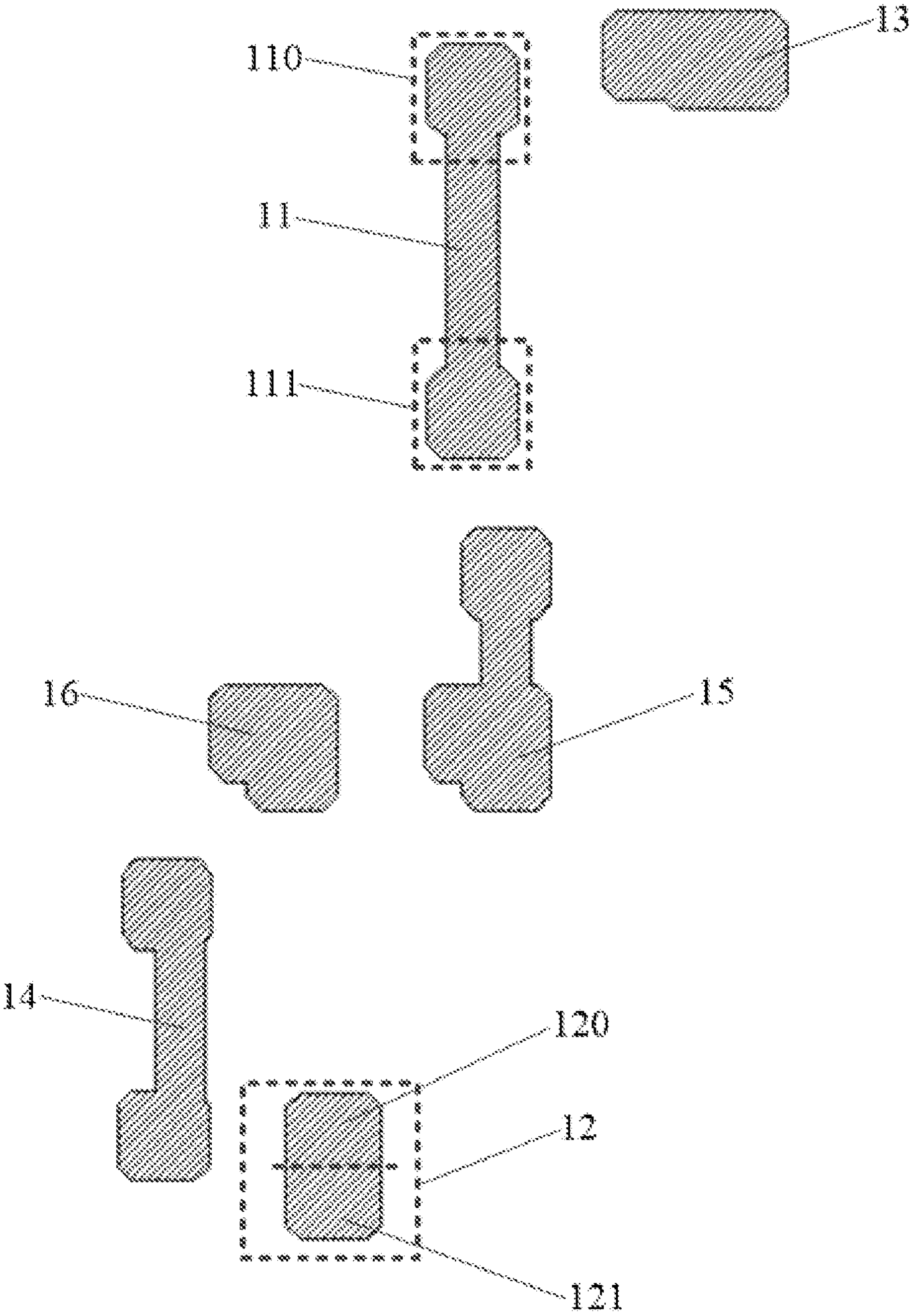
FIG. 10 is a schematic view showing the layout of the first source/drain metal layer in FIG. 3.
Figure 19:
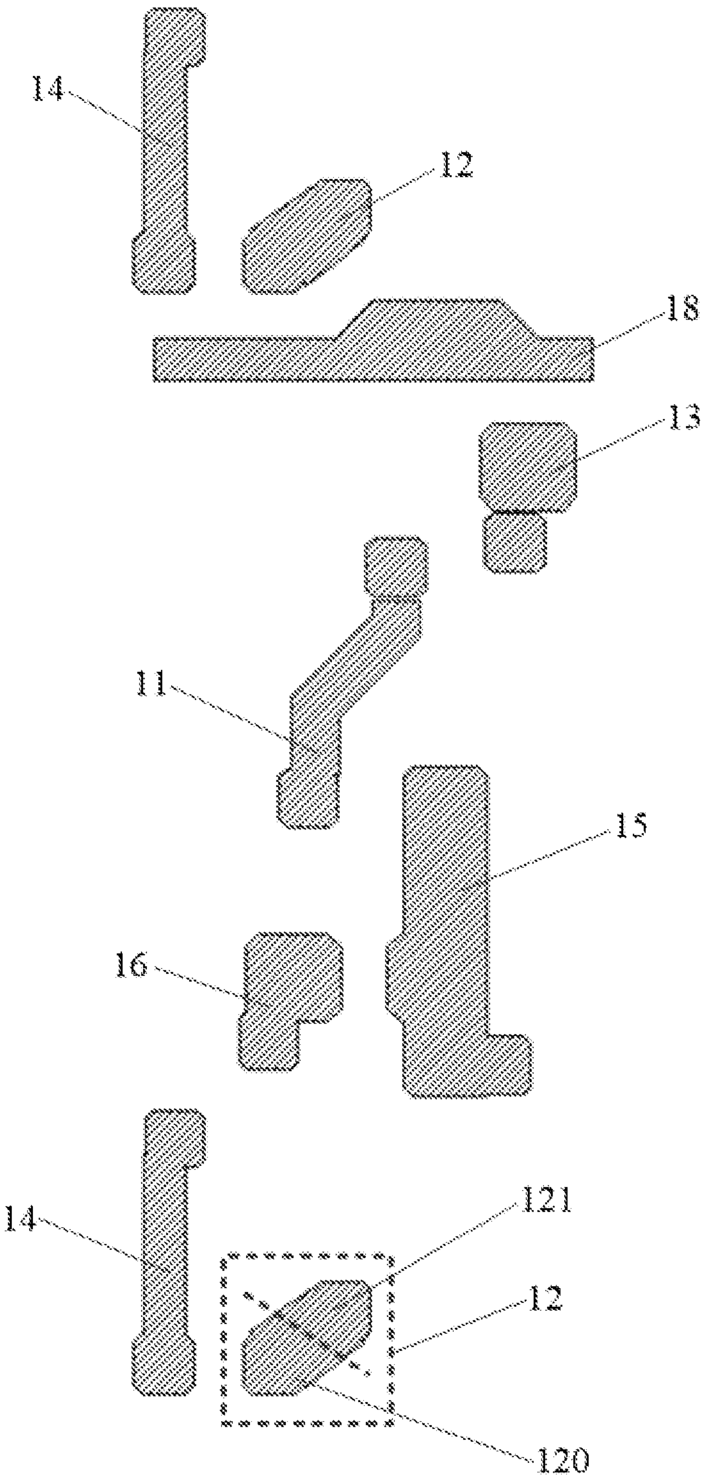
FIG. 19 is a schematic view showing the layout of the first source/drain metal layer in FIG. 12.

As shown in FIGS. 10 and 19, the first source/drain metal layer is used to form the first conductive connection portion 11, the second conductive connection portion 12, the third conductive connection portion 13, a fourth conductive connection portion 14, a fifth conductive connection portion 15, and a sixth conductive connection portion 16. The gate electrode T3-*g* of the driving transistor T3 and the second electrode of the compensation transistor T2 are coupled to each other through the first conductive connection portion 11, the first electrode of the first reset transistor T1 and the first initialization signal line Vinit1 are coupled to each other through the second conductive connection portion 12, the first electrode of the data write-in transistor T4 and the data line DA are coupled to each other through third conductive connection portion 13, the first electrode of the second reset transistor T7 and the second initialization signal line Vinit2 are coupled to each other through the fourth conductive connection portion 14, the first electrode of the power source control transistor T5 and a corresponding power source line VDD are coupled to each other through the fifth conductive connection portion 15, the second electrode of the light-emission control transistor T6 and a seventh conductive connection portion 17 are coupled to each other through the sixth conductive connection portion 16, and the seventh conductive connection portion 17 is coupled to a corresponding anode.

As shown in FIGS. 11 and 20, the second source/drain metal layer is used to form he power source line VDD, the data line DA, and the seventh conductive connection portion 17.

The display substrate is manufactured as follows.

An organic polyimide (PI) base substrate is formed on a glass substrate.

An active material layer is deposited on the organic PI base substrate, a photoresist is applied onto the active material layer with a photoresist, and then an active layer is obtained through exposure, development and etching.

Next, an inorganic dielectric layer is deposited on the active layer to form the first gate insulation layer.

Next, a first gate metal material layer is deposited on the first gate insulation layer, a photoresist is applied onto the first gate metal material layer, and then the first gate metal layer is obtained through exposure, development and dry-etching.

Next, an inorganic dielectric layer is deposited on the first gate metal layer to form the second gate insulation layer.

Next, a second gate metal layer material layer is deposited on the second gate insulation layer, a photoresist is applied onto the second gate metal material layer, and then the second gate metal layer is obtained through exposure, development and dry-etching.

Next, an interlayer insulation layer is deposited on the second gate metal layer, a photoresist is applied onto the interlayer insulation layer, and then the interlayer insulation layer is patterned through exposure, development and dry-etching. The patterned interlayer insulation layer includes a via hole through which the first source/drain metal layer is coupled to a conductive film layer below the interlayer insulation layer.

Next, a first source/drain metal material layer is deposited on the interlayer insulation layer, a photoresist is applied onto the first source/drain metal material layer, and then the first source/drain metal layer is obtained through exposure, development and dry-etching.

Next, a first planarization layer is deposited on the first source/drain metal layer, a photoresist is applied onto the first planarization layer, and then the first planarization layer is patterned through exposure, development and dry-etching.

Finally, a second source/drain metal material layer is deposited on the first planarization layer, a photoresist is applied onto the second source/drain metal material layer, and then the second source/drain metal layer is obtained through exposure, development and dry-etching.

The present disclosure further provides in some embodiments a display device including the above-mentioned display substrate.

It should be appreciated that, the display device may be any product or member having a display function, e.g., television, display, digital photo frame, mobile phone or tablet computer. The display device further includes a flexible circuit board, a printed circuit board and a back plate. Examples of the display device include an organic light-emitting display device, a light-emitting diode display device, a quantum-dot light-emitting display device, a micro-light-emitting-diode display device, and the like.

According to the display substrate in the embodiments of the present disclosure, the shielding pattern 30 is coupled to a corresponding the initialization signal line, so that a stable initialization signal is applied to the shielding pattern 30. The orthogonal projection of the shielding pattern 30 onto the base substrate 100 at least partially overlaps with the orthogonal projection of the compensation connection portion 213 onto the base substrate 100, so it is able to prevent the influence of a signal on the compensation connection portion 213 through the shielding pattern 30, and provide the compensation transistor T2 with stable characteristics, thereby to ensure the operation performance of the sub-pixel driving circuitry as well as the display quality of the display substrate.

Furthermore, the initialization signal line extends in the first direction D1, the orthogonal projection of the initialization signal line onto the base substrate 100 and the orthogonal projection of the compensation connection portion 213 onto the base substrate 100 are arranged in the second direction D2, and the initialization signal line is arranged close to the compensation connection portion 213. When the shielding pattern 30 is coupled to the initialization signal line and the compensation connection portion 213 is shielded by the shielding pattern 30, it is able to reduce the size of the shielding pattern 30 to the greatest extent, and reduce the layout difficulty of the shielding pattern 30, thereby to ensure the shielding effect in the case of a limited sub-pixel layout space.

When the display device includes the above-mentioned display substrate, it also has the above-mentioned beneficial effects, which will not be particularly defined herein.

It should be appreciated that, when a signal line extends in an X direction, it means that the signal line includes a primary portion and a secondary portion coupled to the primary portion. The primary portion is a line, a line segment or a strip-like structure. The primary portion extends in the X direction, and a length of the primary portion in the X direction is greater than a length of the secondary portion in the other direction.

It should be appreciated that, the expression “at a same layer” refers to that the film layers are arranged on a same structural layer. Alternatively, for example, the film layers on a same layer may be layer structures formed through forming thin layers for forming specific patterns through a single-film-forming process and then patterning the film layers with a same mask through a single patterning process. Depending on different specific patterns, a single patterning process may include multiple exposing, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as “first” and “second” used in the specification and claims are merely used to differentiate different components rather than to represent any order, number or importance. Similarly, such words as “one” or “one of” are merely used to represent the existence of at least one member, rather than to limit the number thereof. Such words as “include” or “including” intends to indicate that an element or object before the word contains an element or object or equivalents thereof listed after the word, without excluding any other element or object. Such words as “connect/connected to” or “couple/coupled to” may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be further appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, and a plurality of sub-pixels and a plurality of initialization signal lines arranged on the base substrate, wherein each sub-pixel in the plurality of sub-pixels comprises a sub-pixel driving circuitry and a shielding pattern, and the sub-pixel driving circuitry comprises a driving transistor and a compensation transistor;

a first electrode of the compensation transistor is coupled to a second electrode of the driving transistor, and a second electrode of the compensation transistor is coupled to a gate electrode of the driving transistor;

the compensation transistor comprises a compensation active layer, the compensation active layer comprises a first compensation channel portion, a second compensation channel portion and a compensation connection portion, and the compensation connection portion is coupled to the first compensation channel portion and the second compensation channel portion; and the shielding pattern is coupled to a corresponding initialization signal line, and an orthogonal projection of the shielding pattern onto the base substrate at least partially overlaps with an orthogonal projection of the compensation connection portion onto the base substrate;

wherein the initialization signal line comprises at least a portion extending in a first direction, and the shielding pattern comprises at least a portion extending in a second direction intersecting the first direction;

the sub-pixel driving circuitry further comprises a first conductive connection portion, a first end of the first conductive connection portion is coupled to the second electrode of the compensation transistor, and a second end of the first conductive connection portion is coupled to the gate electrode of the driving transistor; and in the first direction, an orthogonal projection of the shielding pattern onto the base substrate, an orthogonal projection of the second compensation channel portion onto the base substrate, and an orthogonal projection of the first end of the first conductive connection portion onto the base substrate are sequentially arranged.

2. The display substrate according to claim 1, wherein the shielding pattern and the corresponding initialization signal line are of a one-piece structure.

3. The display substrate according to claim 1, wherein the shielding pattern comprises a strip-like pattern extending along the second direction, a first end of the shielding pattern is coupled to the initialization signal line, and an orthogonal projection of a second end of the shielding pattern onto the base substrate at least partially overlaps with the orthogonal projection of the compensation connection portion onto the base substrate; and in the first direction, a width of the second end of the shielding pattern is larger than a width of the first end of the shielding pattern.

4. The display substrate according to claim 1, wherein the sub-pixel further comprises a connection pattern, the sub-pixel driving circuitry further comprises a first reset transistor, a second electrode of the first reset transistor is coupled to the second electrode of the compensation transistor through the connection pattern, and the orthogonal projection of the shielding pattern onto the base substrate does not overlap with an orthogonal projection of the connection pattern onto the base substrate.

5. The display substrate according to claim 4, wherein the orthogonal projection of the shielding pattern onto the base substrate and the orthogonal projection of the connection pattern onto the base substrate are arranged in the first direction.

6. The display substrate according to claim 4, wherein the sub-pixel further comprises a light-emitting element, the sub-pixel driving circuitry further comprises a second reset transistor, and a second electrode of the second reset transistor is coupled to an anode of the light-emitting element; and the second reset transistor comprises a second reset active layer, and an orthogonal projection of the second reset active layer onto the base substrate and the orthogonal projection of the shielding pattern onto the base substrate are arranged in the second direction.

7. The display substrate according to claim 6, wherein the plurality of initialization signal lines comprises a plurality of first initialization signal lines, the shielding pattern is coupled to a corresponding first initialization signal line, and a first electrode of the first reset transistor is coupled to the first initialization signal line; and the display substrate further comprises a plurality of second initialization signal lines, the first electrode of the second reset transistor is coupled to a corresponding second initialization signal line, and the orthogonal projection of the second reset active layer onto the base substrate does not overlap with an orthogonal projection of the first initialization signal line onto the base substrate.

8. The display substrate according to claim 7, wherein the sub-pixel further comprises a second conductive connection portion, a first end of the second conductive connection portion is coupled to the first electrode of the first reset transistor, and a second end of the second conductive connection portion is coupled to the first initialization signal line; and an orthogonal projection of the first end of the second conductive connection portion onto the base substrate is located at a first side of the orthogonal projection of the first initialization signal line onto the base substrate, the orthogonal projection of the shielding pattern onto the base substrate is located at a second side of the orthogonal projection of the first initialization signal line onto the base substrate, and the first side is opposite to the second side in the second direction.

9. The display substrate according to claim 1, further comprising a plurality of power source lines, wherein each power source line in the plurality of power source lines comprises at least a portion extending in the second direction, and the orthogonal projection of the shielding pattern onto the base substrate does not overlap with an orthogonal projection of the power source line onto the base substrate.

10. The display substrate according to claim 1, wherein the plurality of initialization signal lines comprises a plurality of second initialization signal lines, and the shielding pattern is coupled to a corresponding second initialization signal line; and the sub-pixel further comprises a light-emitting element, the sub-pixel driving circuitry further comprises a second reset transistor, a first electrode of the second reset transistor is coupled to a corresponding second initialization signal line, and a second electrode of the second reset transistor is coupled to an anode of the light-emitting element.

11. The display substrate according to claim 1, further comprising a display region, a transition region and an under-screen camera region, wherein at least one of the display region, the transition region and the under-screen camera region comprises the sub-pixels.

12. The display substrate according to claim 1, further comprising a plurality of data lines, a plurality of gate lines, a plurality of light-emission control lines and a plurality of power source lines, wherein the sub-pixel driving circuitry further comprises a storage capacitor, a data write-in transistor, a power source control transistor and a light-emission control transistor;

a gate electrode of the data write-in transistor is coupled to a corresponding gate line, a first electrode of the data write-in transistor is coupled to a corresponding data line, and a second electrode of the data write-in transistor is coupled to a first electrode of the driving transistor;

a gate electrode of the power source control transistor is coupled to a corresponding light-emission control signal line, a first electrode of the power source control transistor is coupled to a power source line, and a second electrode of the power source control transistor is coupled to the first electrode of the driving transistor;

a gate electrode of the light-emission control transistor is coupled to a corresponding light-emission control signal line, a first electrode of the light-emission control transistor is coupled to the second electrode of the driving transistor, and a second electrode of the light-emission control transistor is coupled to the light-emitting element in the sub-pixel; and a first plate of the storage capacitor is coupled to the gate electrode of the driving transistor, and a second plate of the storage capacitor is coupled to a corresponding power source line.

13. A display device, comprising the display substrate according to claim 1.

14. A display substrate, comprising a base substrate, and a plurality of sub-pixels and a plurality of initialization signal lines arranged on the base substrate, wherein each sub-pixel in the plurality of sub-pixels comprises a sub-pixel driving circuitry and a shielding pattern, and the sub-pixel driving circuitry comprises a driving transistor and a compensation transistor;

a first electrode of the compensation transistor is coupled to a second electrode of the driving transistor, and a second electrode of the compensation transistor is coupled to a gate electrode of the driving transistor;

the compensation transistor comprises a compensation active layer, the compensation active layer comprises a first compensation channel portion, a second compensation channel portion and a compensation connection portion, and the compensation connection portion is coupled to the first compensation channel portion and the second compensation channel portion; and the shielding pattern is coupled to a corresponding initialization signal line, and an orthogonal projection of the shielding pattern onto the base substrate at least partially overlaps with an orthogonal projection of the compensation connection portion onto the base substrate;

wherein the initialization signal line comprises at least a portion extending in a first direction, and the shielding pattern comprises at least a portion extending in a second direction intersecting the first direction;

the sub-pixel driving circuitry further comprises a first conductive connection portion, a first end of the first conductive connection portion is coupled to the second electrode of the compensation transistor, and a second end of the first conductive connection portion is coupled to the gate electrode of the driving transistor; and at least a portion of the orthogonal projection of the shielding pattern onto the base substrate and an orthogonal projection of the first conductive connection portion onto the base substrate are arranged in the second direction.

15. The display substrate according to claim 14, wherein the sub-pixel further comprises a connection pattern, the sub-pixel driving circuitry further comprises a first reset transistor, a second electrode of the first reset transistor is coupled to the second electrode of the compensation transistor through the connection pattern, and the orthogonal projection of the shielding pattern onto the base substrate partially overlaps with an orthogonal projection of the connection pattern onto the base substrate.

16. The display substrate according to claim 15, wherein the sub-pixel further comprises a light-emitting element, the sub-pixel driving circuitry further comprises a second reset transistor, a second electrode of the second reset transistor is coupled to an anode of the light-emitting element, and the second reset transistor comprises a second reset active layer; and the first end of the shielding pattern is coupled to the initialization signal line, and an orthogonal projection of the second end of the shielding pattern onto the base substrate at least partially overlaps with the orthogonal projection of the compensation connection portion onto the base substrate, an orthogonal projection of the first end of the shielding pattern onto the base substrate and at least a portion of an orthogonal projection of the second reset active layer onto the base substrate are arranged along the first direction, and an orthogonal projection of the second end of the shielding pattern onto the base substrate and the orthogonal projection of the second reset active layer onto the base substrate are arranged in the second direction.

17. The display substrate according to claim 16, wherein the plurality of initialization signal lines comprises a plurality of first initialization signal lines, the shielding pattern is coupled to a corresponding first initialization signal line, and a first electrode of the first reset transistor is coupled to the first initialization signal line; and the display substrate further comprises a plurality of second initialization signal lines, a first electrode of the second reset transistor is coupled to a corresponding second initialization signal line, and the orthogonal projection of the second reset active layer onto the base substrate partially overlaps with an orthogonal projection of the first initialization signal line onto the base substrate.

18. The display substrate according to claim 17, wherein the sub-pixel further comprises a second conductive connection portion, a first end of the second conductive connection portion is coupled to the first electrode of the first reset transistor, and a second end of the second conductive connection portion is coupled to the first initialization signal line; and an orthogonal projection of the first end of the second conductive connection portion onto the base substrate and the orthogonal projection of the shielding pattern onto the base substrate are located at a same side of the orthogonal projection of the first initialization signal line on the base substrate.

19. The display substrate according to claim 14, further comprising a plurality of power source lines, wherein each power source line in the plurality of power source lines comprises at least a portion extending in the second direction, and the orthogonal projection of the shielding pattern onto the base substrate overlaps with an orthogonal projection of the power source line onto the base substrate.

* * * * *